United States Patent
Chen et al.

(10) Patent No.: US 11,290,126 B2
(45) Date of Patent: Mar. 29, 2022

(54) KEY SCANNING METHOD, SCAN METHOD FOR KEY SCAN CIRCUIT, AND INPUT DEVICE IMPLEMENTED THEREWITH

(71) Applicants: Darfon Electronics Corp., Taoyuan (TW); DARFON ELECTRONICS (SUZHOU) CO., LTD., Jiangsu (CN)

(72) Inventors: Xi Sheng Chen, Taoyuan (TW); Te Ping Hsu, Taoyuan (TW)

(73) Assignees: Darfon Electronics Corp., Taoyuan (TW); DARFON ELECTRONICS (SUZHOU) CO., LTD., Jiangsu (CN)

( * ) Notice: Subject to any disclaimer, the term of this patent is extended or adjusted under 35 U.S.C. 154(b) by 0 days.

(21) Appl. No.: 17/056,761

(22) PCT Filed: Jun. 6, 2019

(86) PCT No.: PCT/CN2019/090357
§ 371 (c)(1),
(2) Date: Nov. 19, 2020

(87) PCT Pub. No.: WO2020/243952
PCT Pub. Date: Dec. 10, 2020

(65) Prior Publication Data
US 2021/0266012 A1    Aug. 26, 2021

(51) Int. Cl.
*G06F 3/023* (2006.01)
*H03M 11/20* (2006.01)

(52) U.S. Cl.
CPC ............. *H03M 11/20* (2013.01); *G06F 3/023* (2013.01)

(58) Field of Classification Search
CPC .............................. H03M 11/20; G06F 3/023
USPC ............................................. 345/168; 341/26
See application file for complete search history.

(56) References Cited

U.S. PATENT DOCUMENTS 4,138,916 A * 2/1979 Kitagawa ............... H03M 11/20
                                                  84/617
4,772,874 A * 9/1988 Hasegawa ............... G06F 3/023
                                                  341/26
5,274,371 A * 12/1993 Yang ..................... H03M 11/20
                                                  341/22

(Continued)

FOREIGN PATENT DOCUMENTS

CN          101257308 A       9/2008
CN          101686060 A       3/2010

(Continued)

*Primary Examiner* — Albert K Wong

(57) ABSTRACT

A key scanning method, a scan method for a key scan circuit, and an input device thereof are provided. The key scanning method comprises performing a first scan procedure which includes triggering a first main scan line and reading electrical signals received via a plurality of signal sensing lines to determine whether any of the keys among a first key group is triggered. Then, performing a second scan procedure which includes triggering at least one of a plurality of secondary scan lines and reading the electrical signals received via the plurality of signal sensing lines to determine whether any of the keys among a second key group is triggered. In the key scanning method, the first scan procedure and the second scan procedure are performed one after another, and each of the secondary scan lines is triggered at least once.

26 Claims, 14 Drawing Sheets

(56) References Cited

U.S. PATENT DOCUMENTS

| | | | | |
|---|---|---|---|---|
| 5,430,443 A * | 7/1995 | Mitchell | H03M 11/003 | 341/22 |
| 5,534,860 A * | 7/1996 | Phillips | H03M 11/20 | 341/22 |
| 5,986,586 A * | 11/1999 | Tsai | G06F 3/0238 | 341/22 |
| 6,191,709 B1 * | 2/2001 | Cho | G06F 1/1616 | 341/26 |
| 6,885,315 B2 * | 4/2005 | Chen | G06F 3/0219 | 341/20 |
| 7,345,598 B2 * | 3/2008 | Li | G06F 3/023 | 341/22 |
| 2006/0007023 A1 * | 1/2006 | Wright | H03M 11/20 | 341/26 |
| 2008/0079611 A1 * | 4/2008 | Togashi | H03M 11/20 | 341/26 |
| 2010/0259424 A1 | 10/2010 | Wang et al. | | |
| 2014/0176352 A1 * | 6/2014 | Hussain | H01H 13/83 | 341/26 |
| 2015/0169101 A1 | 6/2015 | Jung | | |

FOREIGN PATENT DOCUMENTS

| | | |
|---|---|---|
| CN | 102227698 A | 10/2011 |
| CN | 105406875 A | 3/2016 |
| TW | I312124 B | 7/2009 |
| TW | 201346514 A | 11/2013 |
| TW | I568196 B | 1/2017 |

* cited by examiner

|  | Col. 0 | Col. 1 | Col. 2 | Col. 3 | Col. 4 | Col. 5 | Col. 6 | Col. 7 | Col. 8 | Col. 9 | Col. 10 |
|---|---|---|---|---|---|---|---|---|---|---|---|
| Row0 | W | A | S | D | ↑ | → | ↓ | → | B | C | E |
| Row1 | P | Q | R | T | U | V | X | Y | Z | ~ | 1 ! |
| Row2 | ESC | F1 | F2 | F3 | F4 | F5 | F6 | F7 | F8 | F9 | F10 |
| Row3 | CAPS LOCK | TAB | L_CTRL | L_SHIFT | FN | L_ALT | SPACE | R_ALT | APP | R_WIN | R_SHIFT |
| Row4 | , < | . > | / ? | ' = + | ; : | ' " | { [ | } ] | \| \ |  |  |
| Row5 | NUM 0 | NUM 1 | NUM 2 | NUM 3 | NUM 4 | NUM 5 | NUM 6 | NUM 7 | NUM 8 | NUM 9 | NUM LOCK |

|  | Col. 11 | Col. 12 | Col. 13 | Col. 14 | Col. 15 | Col. 16 | Col. 17 | Col. 18 | Col. 19 | Col. 20 |
|---|---|---|---|---|---|---|---|---|---|---|
| Row0 | F | G | H | I | J | K | L | M | N | O |
| Row1 | 2 @ | 3 # | 4 $ | 5 % | 6 ^ | 7 & | 8 * | 9 ( | 0 ) | - _ |
| Row2 | F11 | F12 | DEL | END | PGDN | INS | HOME | PGUP |  |  |
| Row3 | R_CTRL | L_ENTER | PRINT | SCROL | PAUSE | BACK SPACE |  |  |  |  |
| Row4 |  |  |  |  |  |  |  |  |  |  |
| Row5 | NUM / | NUM * | NUM / | NUM . | NUM + | R_ENTER |  |  |  |  |

FIG. 4A

|       | Col. 0 | Col. 1 | Col. 2 | Col. 3 | Col. 4 | Col. 5 | Col. 6 | Col. 7 | Col. 8 | Col. 9 | Col. 10 |
|-------|--------|--------|--------|--------|--------|--------|--------|--------|--------|--------|---------|
| Sa(1) | W | A | S | D | ← | → | ↓ | → | B | C | E |
| Sb(1) | P | Q | R | T | U | V | X | Y | Z | ` ~ | 1 ! |
| Sb(2) | ESC | F1 | F2 | F3 | F4 | F5 | F6 | F7 | F8 | F9 | F10 |
| Sb(3) | CAPS LOCK | TAB | L_CTRL | L_SHIFT | FN | L_ALT | SPACE | R_ALT | APP | R_WIN | R_SHIFT |
| Sb(4) | , < | . > | / ? | ' = + | ; : | ' " | { [ | } ] | \| \ |  |  |
| Sb(5) | NUM 0 | NUM 1 | NUM 2 | NUM 3 | NUM 4 | NUM 5 | NUM 6 | NUM 7 | NUM 8 | NUM 9 | NUM LOCK |

|       | Col. 11 | Col. 12 | Col. 13 | Col. 14 | Col. 15 | Col. 16 | Col. 17 | Col. 18 | Col. 19 | Col. 20 |
|-------|---------|---------|---------|---------|---------|---------|---------|---------|---------|---------|
| Sa(1) | F | G | H | I | J | K | L | M | N | O |
| Sb(1) | 2 @ | 3 # | 4 $ | 5 % | 6 ^ | 7 & | 8 * | 9 ( | 0 ) | - _ |
| Sb(2) | F11 | F12 | DEL | END | PGDN | INS | HOME | PGUP |  |  |
| Sb(3) | R_CTRL | L_ENTER | PRINT | SCROL | PAUSE | BACK SPACE |  |  |  |  |
| Sb(4) |  |  |  |  |  |  |  |  |  |  |
| Sb(5) | NUM / | NUM * | NUM / | NUM . | R_ENTER | NUM + |  |  |  |  |

FIG. 4B

|       | Col. 0 | Col. 1 | Col. 2 | Col. 3 | Col. 4 | Col. 5 | Col. 6 | Col. 7 | Col. 8 | Col. 9 | Col. 10 |
|-------|--------|--------|--------|--------|--------|--------|--------|--------|--------|--------|---------|
| Sa(1) | W | A | S | D | → | ↓ | → | B | C | E |  |
| Sa(2) | P | Q | R | T | U | V | Y | Z | " ' | 1 ! |  |
| Sb(1) | ESC | F1 | F2 | F3 | F4 | F5 | F6 | F7 | F8 | F9 | F10 |
| Sb(2) | CAPS LOCK | TAB | L_CTRL | L_SHIFT | FN | L_ALT | SPACE | R_ALT | APP | R_WIN | R_SHIFT |
| Sb(3) | , < | . > | / ? | ' = + | , ; : | , " | { [ | } ] | \| \ |  |  |
| Sb(4) | NUM 0 | NUM 1 | NUM 2 | NUM 3 | NUM 4 | NUM 5 | NUM 6 | NUM 7 | NUM 8 | NUM 9 | NUM LOCK |

|       | Col. 11 | Col. 12 | Col. 13 | Col. 14 | Col. 15 | Col. 16 | Col. 17 | Col. 18 | Col. 19 | Col. 20 |
|-------|---------|---------|---------|---------|---------|---------|---------|---------|---------|---------|
| Sa(1) | F | G | H | I | J | K | L | M | N | O |
| Sa(2) | 2 @ | 3 # | 4 $ | 5 % | 6 ^ | 7 & | 8 * | 9 ( | 0 ) | - _ |
| Sb(1) | F11 | F12 | DEL | END | PGDN | INS | HOME |  |  |  |
| Sb(2) | R_CTRL | L_ENTER | PRINT | SCROL | PAUSE | BACK SPACE | PGUP |  |  |  |
| Sb(3) |  |  |  |  |  |  |  |  |  |  |
| Sb(4) | NUM / | NUM * | NUM / | NUM . | NUM + | R_ENTER |  |  |  |  |

FIG. 4C

KEY SCANNING METHOD, SCAN METHOD FOR KEY SCAN CIRCUIT, AND INPUT DEVICE IMPLEMENTED THEREWITH

FIELD OF THE INVENTION

The present invention relates to key scanning technology, and more particularly to a key scanning method, a scan method for the key scan circuit, and an input device implemented with the methods, where crucial keys among all keys of an input device are interspersedly scanned multiple times to shorten the scan period of the crucial keys.

BACKGROUND OF THE INVENTION

As the electronic sports (e-sports) culture becomes more and more popular, consumers gradually choose to buy e-sports products for works or games. The e-sports industry not only promotes the trend of digital competitions, but also promotes the advance in hardware. For an e-sports player or a keyboard enthusiast, a mechanical keyboard that responds quickly to keystrokes and remains durable and reliable even after a large number of keystrokes is absolutely indispensable. In fact, e-sports players usually only use specific keys on keyboards to play related e-sports games. At present, most of the keyboards for e-sports shorten the response time of all the keys by improving their mechanical structures or materials. Therefore, how to greatly increase the response speed of specific keys by improving the scanning method will be the problem focused in the present invention.

SUMMARY OF THE INVENTION

An embodiment of the present invention provides a key scanning method adapted to an input device having a plurality of keys. The input device further has a plurality of scan lines for scanning the plurality of keys and a plurality of signal sensing lines corresponding to the plurality of keys. The plurality of scan lines comprise a first main scan line and a plurality of secondary scan lines, wherein the first main scan line is electrically connected to a first key group among the plurality of keys, and the plurality of secondary scan lines are electrically connected to a second key group among the plurality of keys. The key scanning method comprises: performing a first scan mode; and performing a second scan procedure. The first scan mode comprises: performing a first scan procedure, the first scan procedure comprises triggering the first main scan line and reading electrical signals received via the plurality of signal sensing lines to determine whether any of the keys among the first key group is triggered. The second scan procedure comprises triggering at least one of the plurality of secondary scan lines and reading the electrical signals received via the plurality of signal sensing lines to determine whether any of the keys among the second key group is triggered, wherein the first scan procedure and the second scan procedure are performed one after another, and each of the plurality of secondary scan lines is triggered at least once.

Another embodiment of the present invention further provides a scan method for a key scan circuit. The key scan circuit is capable of scanning a first key group and a second key group. The first key group comprises X priority keys. The second key group comprises Y secondary keys. The key scan circuit comprises M main scan lines Sa(1) to Sa(M), N secondary scan lines Sb(1) to Sb(N) and a plurality of signal sensing lines, where X, Y, M and N are positive integers. The M main scan lines Sa(1) to Sa(M) are electrically connected to the X priority keys. The N secondary scan lines Sb(1) to Sb(N) are electrically connected to the Y secondary keys. The scan method comprises following steps: step (1), starting a scan cycle and setting an initial value of a main scan count j to 0; step (2a), determining whether the main scan count j is equal to a main scan default upper limit Jmax, where Jmax is a positive integer, performing step (3) if yes, and performing step (2b) if no; step (2b), sequentially triggering each of the M main scan lines Sa(1) to Sa(M) and reading electrical signals received via the plurality of signal sensing lines to detect whether any of the X priority keys is triggered; step (2c), increasing a value of the main scan count j as j=j+1, and returning to step (2a); step (3), sequentially triggering P secondary scan lines of the N secondary scan lines Sb(1) to Sb(N) and reading the electrical signals received via the plurality of signal sensing lines, wherein the P secondary scan lines are coupled to Q secondary keys of the Y secondary keys to detect whether any of the Q secondary keys is triggered, where P<N and Q<Y, and P and Q are positive integers; and step (4), during the scan cycle, determining whether all the N secondary scan lines Sb(1) to Sb(N) have been triggered, ending the scan cycle if yes, and setting the main scan count j to 0 and returning to step (2a) if no.

Another embodiment of the present invention further provides an input device comprising a key scan circuit, a first key group, and a second key group. The key scan circuit comprises M main scan lines Sa(1) to Sa(M), N secondary scan lines Sb(1) to Sb(N) and a plurality of signal sensing lines, where M and N are positive integers. The first key group comprises X priority keys, and the M main scan lines Sa(1) to Sa(M) are electrically connected to the X priority keys, where X is a positive integer. The second key group comprises Y secondary keys, and the N secondary scan lines Sb(1) to Sb(N) are electrically connected to the Y secondary keys, where Y is a positive integer. The key scan circuit performs the following steps (1), (2a), (2b), (3), and (4). Step (1) starts a scan cycle and sets an initial value of a main scan count j to 0. Step (2a) determines whether the main scan count j is equal to a main scan default upper limit Jmax, where Jmax is a positive integer, and then performs step (3) if yes, and performs step (2b) if no. Step (2b) sequentially triggers each of the M main scan lines Sa(1) to Sa(M) and reads electrical signals received via the plurality of signal sensing lines to detect whether any of the X priority keys is triggered. Step (2c) increases a value of the main scan count j as j=j+1, and returns to step (2a). Step (3) sequentially triggers P secondary scan lines of the N secondary scan lines Sb(1) to Sb(N) and reads the electrical signals received via the plurality of signal sensing lines. The P secondary scan lines are coupled to Q secondary keys of the Y secondary keys to detect whether any of the Q secondary keys is triggered, where P<N and Q<Y, and P and Q are positive integers. And step (4) determines, during the scan cycle, whether all the N secondary scan lines Sb(1) to Sb(N) have been triggered, and then end the scan cycle if yes, and set the main scan count j to 0 and return to step (2a) if no.

Another embodiment of the present invention further provides an input device, comprising: a key scan circuit, which comprises N+1 scan lines Row 0 to Row N and a plurality of signal sensing lines, where N is a positive integer. The key scan circuit performs following steps (1), (2), (3), and (4). Step (1) starts a scan cycle and determines whether the input device is currently in one of a first scan mode, a second scan mode, or a third scan mode to respectively perform one of step (2), step (3) or step (4). Step (2), when the input device is in the first scan mode, the key scan circuit sequentially triggers one of the plurality of scan lines Row 0 to Row N until each of the plurality of scan lines is triggered, reads electrical signals received via the plurality of signal sensing lines, detects whether any key of the input device is triggered, and ends the scan cycle. Step (3), when the input device is in the second scan mode, performs steps (3a), (3b), (3c), (3d), (3e), (3f), (3g), and (3i). Step (3a), the key scan circuit defines the scan line Row 0 as a first main scan line Sa(1) and defines the scan lines Row 1 to Row N as N secondary scan lines Sb(1) to Sb(N). Step (3b), the key scan circuit defines X1 keys electrically connected to the first main scan line Sa(1) as a first key group and defines another Y1 keys not electrically connected to the first main scan line Sa(1) as a second key group, where X1 and Y1 are positive integers. Step (3c) sets an initial value of a main scan count j to 0. Step (3d) determines whether the main scan count j is equal to a preset upper limit Jmax, where the preset upper limit Jmax is a positive integer, performs step (3g) if yes, and performs step (3e) if no. Step (3e) triggers the first main scan line Sa(1), reads the electrical signals received via the plurality of signal sensing lines, and detects whether any of the X1 priority keys is triggered. Step (3f) increases a value of the main scan count j as j=j+1, and returns to step (3d). Step (3g) sequentially triggers P of the N secondary scan lines Sb(1) to Sb(N), wherein the P secondary scan lines are coupled to Q secondary keys of the Y1 secondary keys, reads the electrical signals received via the plurality of signal sensing lines, and detects whether any of the Q secondary keys is triggered, where P<N and Q<Y1, and P and Q are positive integers. Step (3i) determines whether all the N secondary scan lines Sb(1) to Sb(N) have been triggered, sets the main scan count j to 0 and returns to step (3d) if no, and ends the scan cycle if yes. Step (4), when the input device is in a third scan mode, performs steps (4a), (4b), (4c), (4d), (4e), (4f), (4g), and (4h). Step (4a), the key scan circuit defines the scan lines Row 0 to Row 1 as two main scan lines Sa(1) to Sa(2) and defines the scan lines Row 2 to Row N as N−1 secondary scan lines Sb(1) to Sb(N−1). Step (4b), the key scan circuit defines X2 keys electrically connected to the two main scan lines Sa(1) to Sa(2) as a first key group and defines another Y2 keys not electrically connected to the two main scan lines Sa(1) to Sa(2) as a second key group, where X2 and Y2 are positive integers. Step (4c) sets an initial value of a main scan count j to 0. Step (4d) determines whether the main scan count j is equal to a preset upper limit Jmax, where the preset upper limit Jmax is a positive integer, performs step (4g) if yes, and performs step (4e) if no. Step (4e) sequentially triggers the two main scan lines Sa(1)~Sa(2), reads the electrical signals received via the plurality of signal sensing lines, and detects whether any of the X2 priority keys is triggered. Step (4f) increases a value of the main scan count j as j=j+1, and returns to step (4d). Step (4g) sequentially triggers P of the N−1 secondary scan lines Sb(1) to Sb(N−1), wherein the P secondary scan lines are coupled to Q secondary keys of the Y2 secondary keys, reads the electrical signals received via the plurality of signal sensing lines, and detects whether any of the Q secondary keys is triggered, where P<N−1 and Q<Y2, and P and Q are positive integers. Step (4h) determines whether all the N−1 secondary scan lines Sb(1) to Sb(N−1) have been triggered, sets the main scan count j to 0 and returns to step (4d) if no, and ends the scan cycle if yes.

In the key scanning method, the scan method for the key scan circuit, and the input device provided by the embodiments of the present invention, the scan period of the crucial keys is shortened by interspersedly scanning the crucial keys or the commonly used keys for multiple times, which increases the number of times of scanning the scan lines coupled to the crucial keys, so that the crucial keys can be scanned faster. Therefore, the scanning period of the crucial keys is greatly shortened, and the response time of the crucial keys is shortened.

The above description is only an overview of the technical solution of the present invention. In order to understand the technical means of the present invention more clearly, it can be implemented according to the content of the specification. In order to make the above and other objects, features, and advantages of the present invention more comprehensible, embodiments are described below in detail with reference to the accompanying drawings, as follows.

BRIEF DESCRIPTION OF THE DRAWINGS

FIG. 4A is a schematic diagram illustrating a 6*21 key matrix, which can be adapted to a keyboard, according to the first embodiment of the present invention;

FIG. 4B is a schematic diagram illustrating a 6*21 key matrix, which can be adapted to a keyboard, in a first scan mode according to the first embodiment of the present invention;

FIG. 4C is a schematic diagram illustrating a 6*21 key matrix, which can be adapted to a keyboard, in a second scan mode according to the first embodiment of the present invention;

DETAILED DESCRIPTION OF PREFERRED EMBODIMENTS

A key scanning method, a scan method for a key scan circuit, and an input device thereof provided by embodiments of the present invention can be applied to electronic products such as desktop computers, notebook computers, or other electronic products that use keyboards. By interspersedly scanning crucial keys or commonly used keys for multiple times to shorten the interval between two consecutive scans of the crucial keys, the number of times scanning the crucial keys per unit time can increase, that is, the crucial keys can be scanned with a higher frequency. Therefore, the interval between two consecutive scans of the crucial keys can be greatly shortened, and the response time of the crucial keys is shortened. In this way, when a user presses the crucial keys, the mechanical action of the crucial keys pressed by a user can be converted into electrical signals more quickly, and the electrical signals can be input to e-sports games or word processing software executed in a host more quickly. The embodiments of the present invention use a storage device that stores commands for performing the key scanning method, and perform the commands of programs by processor electrically connected to the storage device, thereby controlling, triggering, or detecting a key scan circuit of the input device to perform a plurality of operations.

Figure 1:
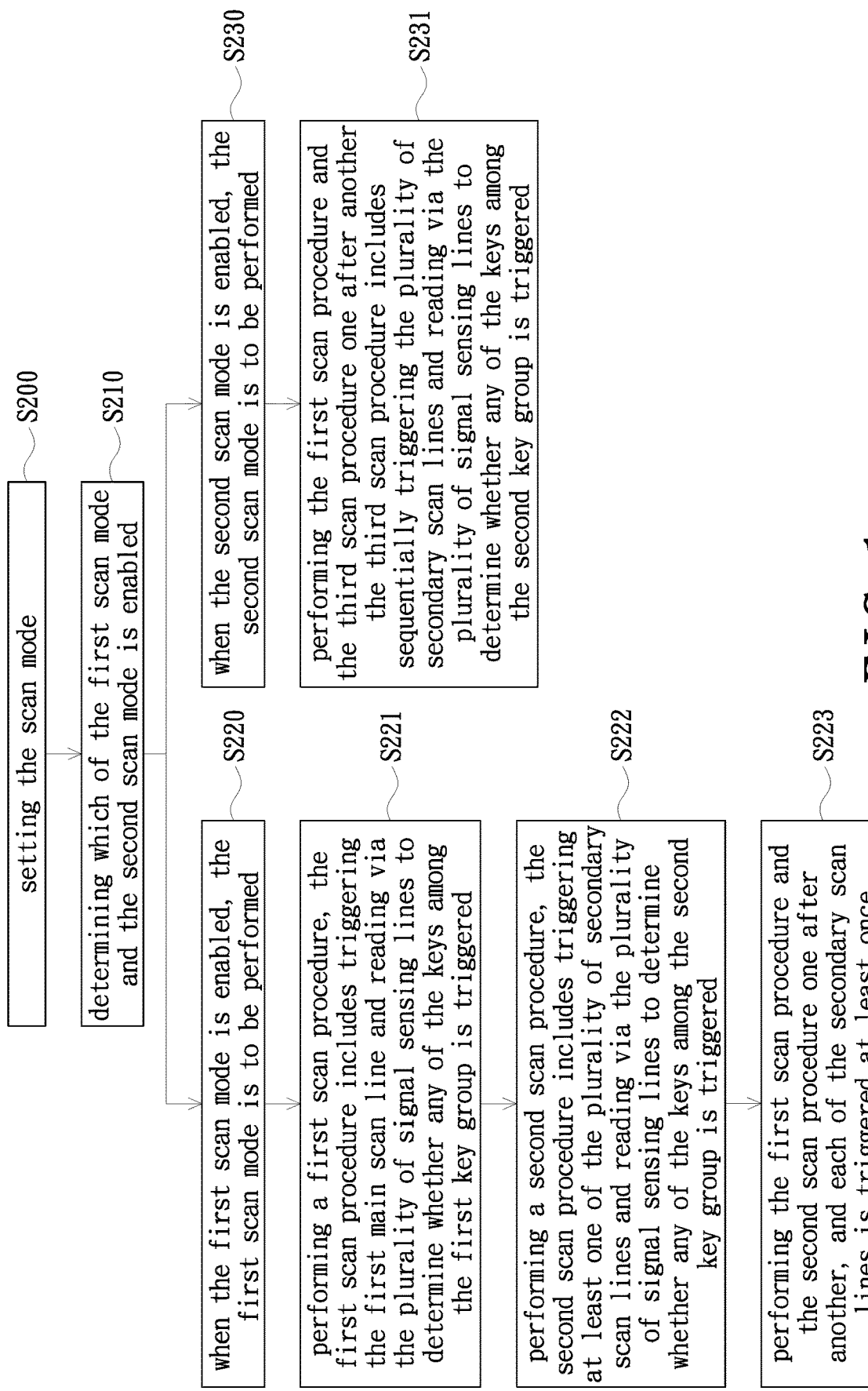
FIG. 1 is a schematic flow diagram illustrating a key scanning method performing a first scan mode and a second scan mode according to a first embodiment of the present invention.
Figure 5:
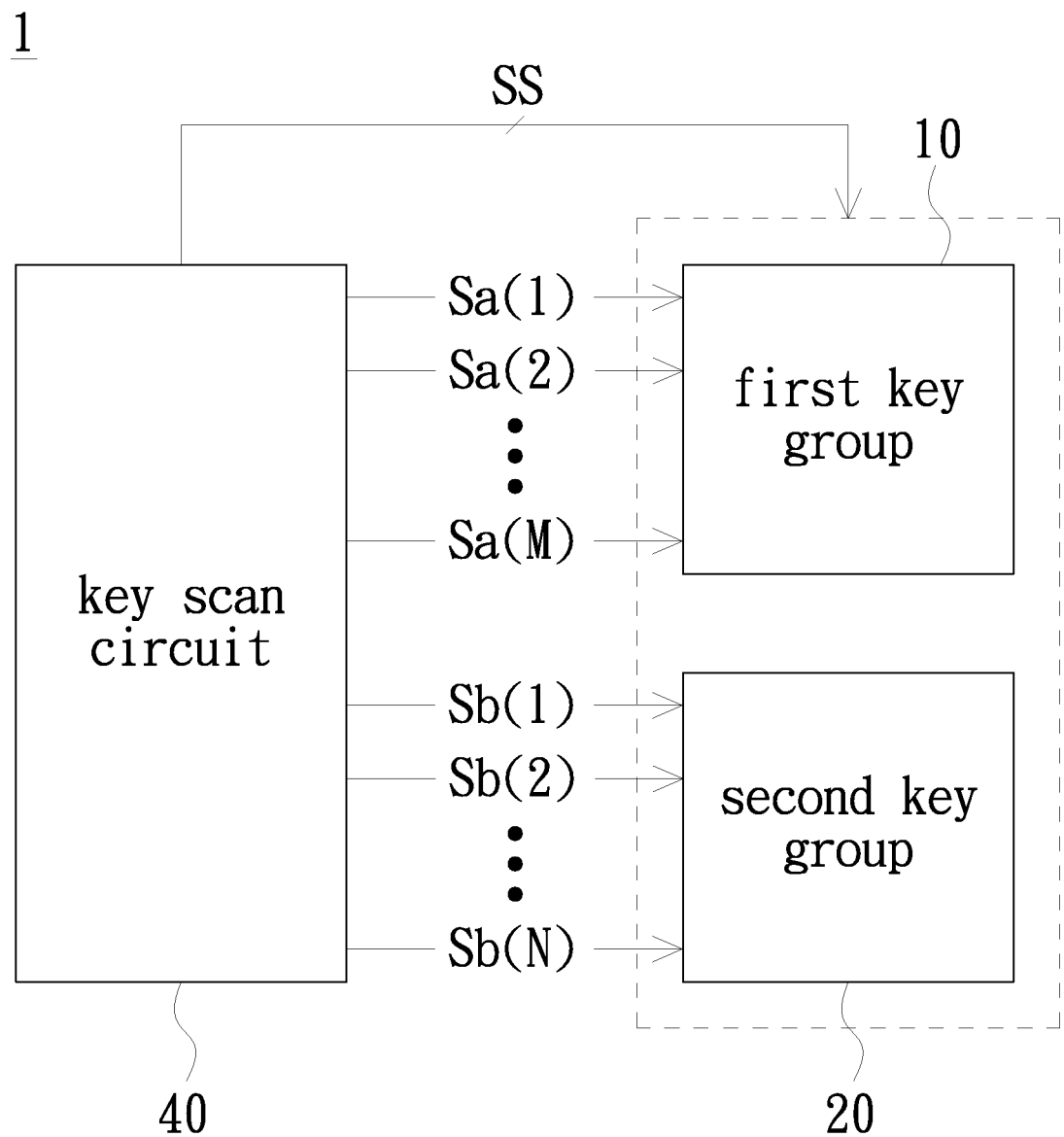
FIG. 5 is a schematic block diagram illustrating a keyboard input device according to an embodiment of the present invention, wherein the input device has two scan modes respectively corresponding to two key groups.
Figure 6:
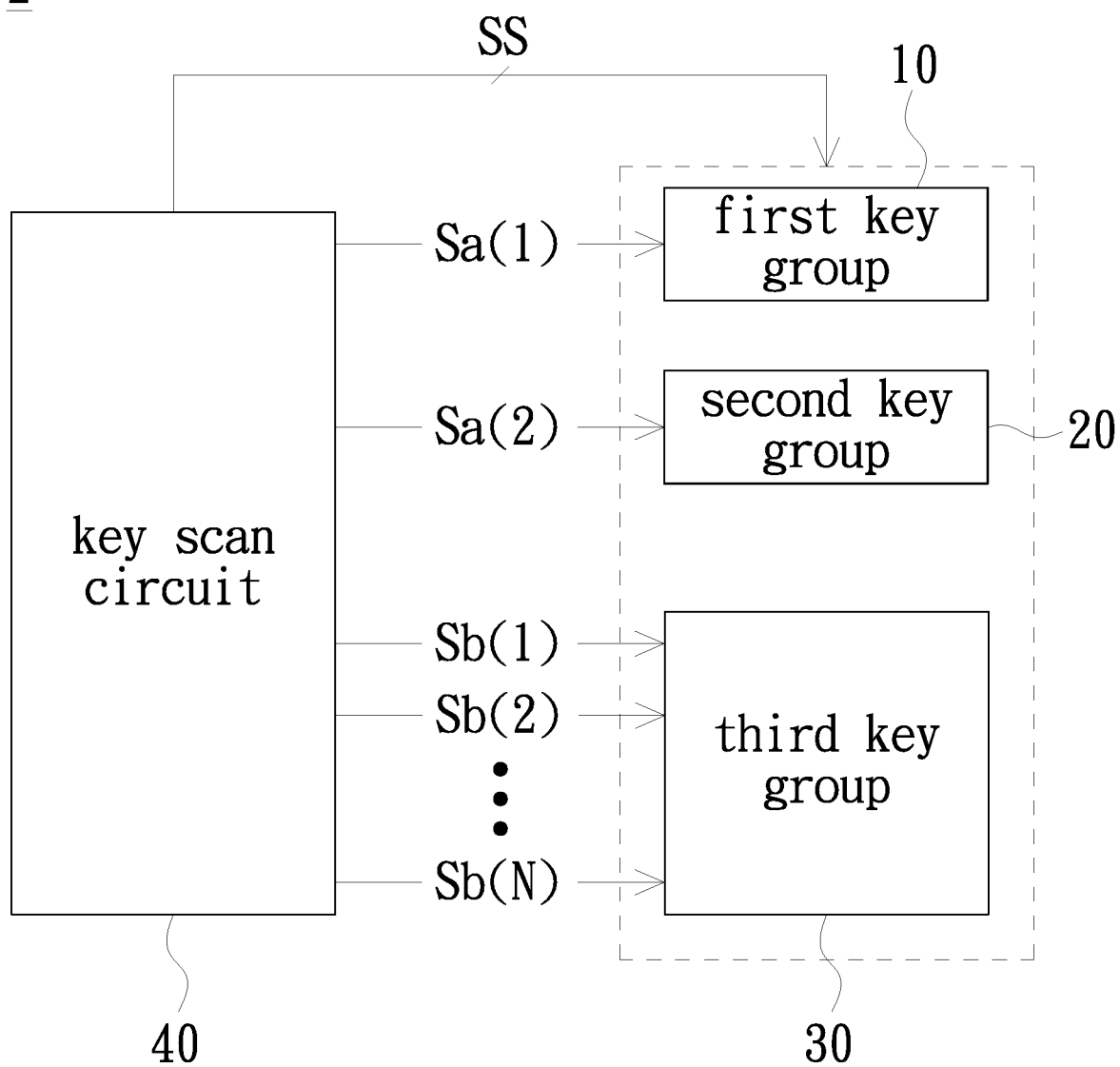
FIG. 6 is a schematic block diagram of another keyboard input device according to the second embodiment of the present invention, wherein the input device has three scan modes respectively corresponding to three key groups.

Please refer to FIG. 1. FIG. 1 is a schematic flow diagram illustrating a key scanning method performing a first scan mode and a second scan mode according to a first embodiment of the present invention. Also, please refer to FIG. 4A to FIG. 6 at the same time in order to understand the key scanning operation flow of the keyboard. FIG. 4A is a schematic diagram illustrating a 6*21 key matrix, which can be adapted to a keyboard, according to the first embodiment of the present invention. FIG. 4B is a schematic diagram illustrating a 6*21 key matrix, which can be adapted to a keyboard, in a first scan mode according to the first embodiment of the present invention. FIG. 4C is a schematic diagram illustrating a 6*21 key matrix, which can be adapted to a keyboard, in a second scan mode according to the first embodiment of the present invention. FIG. 5 is a schematic block diagram illustrating a keyboard input device according to the first embodiment of the present invention, wherein the input device has two scan modes respectively corresponding to two key groups. FIG. 6 is a schematic block diagram of another keyboard input device 2 according to a second embodiment of the present invention, wherein the input device has three scan modes respectively corresponding to three key groups.

The first embodiment provides a key scanning method, adapted to an input device having a plurality of keys. A part of the plurality of keys composes a first key group 10. Another part of the plurality of keys composes a second key group 20. The input device further has plurality of scan lines for scanning the plurality of keys. The plurality of scan lines comprise a first main scan line Sa(1) and a plurality of secondary scan lines Sb(1) to Sb(N), wherein the first main scan line Sa(1) is electrically connected to the first key group 10 (specifically connected to the keys comprised by the first key group 10). The plurality of secondary scan lines Sb(1) to Sb(N) are electrically connected to the second key group 20 (specifically connected to the keys comprised by the second key group 20).

A configuration of the plurality of keys is a matrix composed of R rows and C columns, where R and C are positive integers greater than or equal to 2. In addition to the plurality of scan lines, the input device further has a plurality of signal sensing lines SS corresponding to the plurality of keys. In actual operation, the plurality of scan lines are disposed corresponding to the first row to the Rth row of the matrix, and the plurality of signal sensing lines SS are disposed corresponding to the first column to the Cth column of the matrix. Taking a 104-key keyboard generally used by most people as an example, currently, the commonly used matrix size is 6 rows*21 columns (that is, R is 6 and C is 21), as such the input device can have 6 scan lines and 21 signal sensing lines. As shown in FIG. 4A, when the input device is in a normal scan mode, a sequence of sequentially triggering the 6 scan lines is: Row 0->Row 1->Row 2->until Row 5, so that each of the 6 scan lines has been triggered a same number of times when a scan cycle is completed. As shown in FIG. 4B, when the input device is in an e-sports scan mode, the key scan circuit classifies the 6 scan lines. Row 0 is set as a first main scan line Sa(1), and Row 1 to Row 5 are set as 5 secondary scan lines Sb(1) to Sb(5). For example, the plurality of keys comprised by the first key group 10 are specific keys frequently used in e-sports games, such as four English letter keys "W", "A", "S" and "D" and four arrow keys "up", "down", "left" and "right". These keys can be configured to the first row Row 0 of the matrix (that is, corresponding to the first main scan line Sa(1)). The other keys that are not frequently used during operating the e-sports games can be configured to the second row Row 1 to the sixth row Row 5 of the matrix (that is, corresponding to the secondary scan lines Sb(1) to Sb(5)). As described later in a flow diagram shown in FIG. 8, when a scan cycle is completed, a number of times that the first main scan line Sa(1) is triggered is larger than a number of times that each of the N secondary scan lines Sb(1) to Sb(N) is triggered. Column orders of the plurality of secondary scan lines Sb(1) to Sb(N), which are Sb(1) to Sb(5), are arranged after a column order of the first main scan line Sa(1). That is, the scanning arrangement priorities of the plurality of secondary scan lines are arranged after the scanning arrangement priority of the first main scan line Sa(1). The plurality of signal sensing lines SS are disposed corresponding to the first column to the Cth column of the matrix, that is, disposed corresponding to the first column to the 21st column (i.e., Col.0 to Col.20) of the matrix.

When the input device has both the e-sports scan mode and a word processing scan mode described later, the first row and the second row of the keys can be disposed refer to FIG. 4C. As shown in FIG. 4C, when the input device is in the word processing scan mode, the key scan circuit classifies the 6 scan lines. Row 0 to Row 1 are set as two main scan lines Sa(1) to Sa(2) (which can be respectively defined as a first main scan line Sa(1) and a second main scan line Sa(2)), and Row 2 to Row 5 are set as four secondary scan lines Sb(1) to Sb(4). For example, the first key group 10 comprises commonly used keys for word processing operations, such as comprising at least 26 English letter keys "A to Z". These keys can be configured to Row 0 to Row 1 of the matrix (which corresponds to the two main scan lines Sa(1) to Sa(2)). The other keys that are not commonly used in word processing operations can be configured to the third row Row 2 to the sixth row Row 5 of the matrix (which corresponds to the secondary scan lines Sb(1) to Sb(4)). As described later in the flow diagram shown in FIG. 9, when a scan cycle is completed, a number of times that each of the two main scan lines Sa(1) to Sa(2) is triggered is higher than a number of times that each of the secondary scan lines Sb(1) to Sb(4) is triggered.

As shown in FIG. 1, the first embodiment of the present invention can be practically applied to a keyboard having two scan modes, such as a normal scan mode (referred to as a normal mode for short) and a e-sports scan mode (referred to as a e-sports mode for short). In step S200, setting the scan mode can be performed by a system with automatic detection and determination. For example, when the system detects that a user has started a game, the system automatically set the scan mode to the first scan mode (e-sports mode). Undoubtedly, the user can also manually perform the setting of the scan mode. In step S210, before the step of performing the first scan mode or performing the second scan mode, the method further includes determining which of the first scan mode and the second scan mode is enabled, that is, determining which mode is to be performed. The second scan mode can be a normal mode. In step S220, when the first scan mode is enabled, the first scan mode is to be performed as shown in steps S221 to S223. Otherwise, in step S230, when the second scan mode is enabled, the second scan mode is to be performed.

Next, please refer to FIG. 1, FIG. 4B and FIG. 5 at the same time to understand the operation flow of the first scan mode. In step S220, the key scanning method includes performing the first scan mode. The first scan mode can be an e-sports mode. The first key group 10 includes a plurality of keys commonly used in operations of e-sports, for example, including at least four English letter keys "W", "A", "S" and "D", and these plurality of keys are electrically connected to the first main scan line Sa(1). The second key group 20 can be other keys other than the plurality of keys. In step S221, the first scan mode includes performing a first scan procedure. The first scan procedure includes triggering the first main scan line Sa(1), and reading electrical signals received via the plurality of signal sensing lines SS to determine whether any of the keys among the first key group 10 is triggered. In step S222, a second scan procedure is performed. The second scan procedure is triggering at least one of the plurality of secondary scan lines Sb(1) to Sb(N), and reading the electrical signals received via the plurality of signal sensing lines SS to determine whether any of the keys among the second key group 20 is triggered. For example, it is determined that whether a key is pressed according to whether the voltage level of the key is high level. In a case that the user only presses the four English letter keys "W", "A", "S" and "D", the electrical signals received via the 21 signal sensing lines SS are read while the first main scan line Sa(1) is triggered, as a result, only the voltage levels of the first to fourth signal sensing lines SS (that is, Col. 0 to Col. 3) are high level, and the rest are low level. In this case, it can be determined that the four English letter keys "W", "A", "S" and "D" are pressed. In other words, it is able to immediately know that the four English letter keys are pressed in the stage of the first scan procedure without waiting until the stage of the second scan procedure. Therefore, the response time of specific keys can be shortened by software, and the response speed can be improved.

In step S223, the first scan procedure and the second scan procedure are performed one after another, and each of the secondary scan lines Sb(1) to Sb(N) is triggered at least once. In other words, the first scan procedure and the second scan procedure are in a manner of scanning interspersedly and alternatively. For example, it can be the first main scan line Sa(1) matching with one secondary scan line, the first main scan line Sa(1) matching with two secondary scan lines, the first main scan line Sa(1) matching with three secondary scan lines, or so on. Taking the first main scan line Sa(1) matching with one secondary scan lines as an example, the first main scan line Sa(1) can be triggered first, then the secondary scan lines Sb(1) is triggered, then the first main scan line Sa(1) is triggered, then the secondary scan lines Sb(2) is triggered, then the first main scan line Sa(1) is triggered, then the secondary scan lines Sb(3) is triggered, then the first main scan line Sa(1) is triggered, then the secondary scan lines Sb(3) is triggered, then the first main scan line Sa(1) is triggered, then the secondary scan lines Sb(4) is triggered; then the first main scan line Sa(1) is triggered, then the secondary scan lines Sb(5) is triggered, as such a scan cycle is completed. Similarly, next scan cycle continues then, and so on. Assuming that the time T triggering a scan line is 0.5 ms. In the first scan mode, the scan cycle of the first key group 10 is 1 ms (2T), that is, the first key group 10 is scanned once every 1 ms. The scan cycle of the second key group 20 is 5 ms (10T), that is, the second key group 20 is scanned every 5 ms. Therefore, the scan cycle of the first key group 10 is greatly shortened, and the key response time of the first key group 10 is also shortened.

When the second scan mode is enabled, the second scan mode is performed as shown in step S230. Please refer to FIG. 1 and FIG. 4A at the same time in order to understand the operation flow of the second scan mode. In step S231, the second scan mode includes performing the first scan procedure and a third scan procedure one after another. The third scan procedure includes sequentially triggering the plurality of secondary scan lines Sb(1) to Sb(N), and reading the electrical signals received via the plurality of signal sensing lines SS to determine whether any of the keys among the second key group 20 is triggered. In other words, the first scan procedure and the third scan procedure are in a manner of scanning interspersedly and alternatively. For example, the first main scan line Sa(1) is triggered first, and then the secondary scan lines Sb(1) to Sb(N) can be sequentially triggered. As such a scan cycle is completed. Similarly, next scan cycle continues then, and so on.

Figure 2:
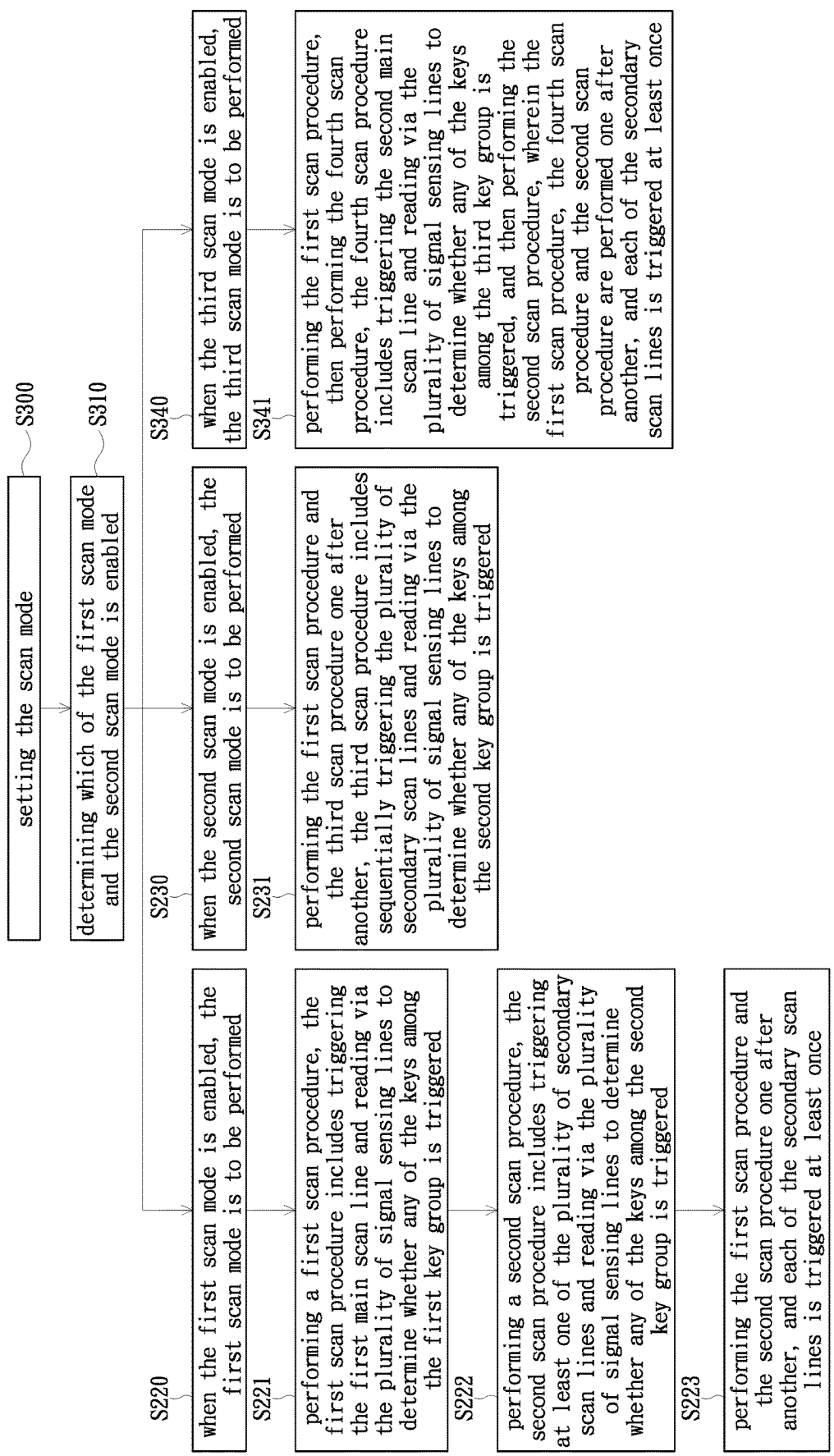
FIG. 2 is a schematic flow diagram illustrating a key scanning method performing a first scan mode, a second scan mode and a third scan mode according to a second embodiment of the present invention.

Then, please refer to FIG. 2, FIG. 4C and FIG. 6 at the same time to understand the operation flow of a third scan mode. FIG. 2 is a schematic flow diagram illustrating a key scanning method performing the first scan mode, the second scan mode and the third scan mode according to the second embodiment of the present invention, that is, the embodiment of the e-sports mode, the normal mode and the word processing scan mode (referred to as a word processing mode for short). In the second embodiment of the present invention, another part of the plurality of keys on the keyboard (input device 2) composes a third key group 30, and the plurality of scan lines used to scan the plurality of keys further comprise a second main scan line Sa(2) in addition to the first main scan line Sa(1), and the second main scan line Sa(2) is electrically connected to the third key group 30 (specifically connected to the keys included in the third key group 30). The key scanning method further includes the third scan mode. Corresponding to the step of determining which of the first scan mode (i.e., the e-sports mode) and the second scan mode (i.e., the normal mode) is enabled shown in FIG. 1, the method shown in FIG. 2 further includes determining whether the third scan mode is enabled. When the third scan mode is enabled, the third scan mode (i.e., the word processing mode) is performed. It should be noted that, the first scan mode and the second scan mode in steps S220 to S231 of the key scanning method have been described in detail in the aforementioned embodiment, and no redundant detail is to be given herein.

In step S300, setting the scan mode can be performed by the system with automatic detection and determination. For example, when the system detects that a user has started word processing software, the system automatically sets the scan mode to the third scan mode, or the user can also manually perform the setting of the scan mode. In step S310, the key scanning method includes determining which of the first scan mode, the second scan mode and the third scan mode is enabled. In step S340, when the third scan mode is enabled, the third scan mode is to be performed.

Next, in step S341, the third scan mode includes performing the first scan procedure (the specific performing content can be as shown in step S221), then performing a fourth scan procedure including triggering the second main scan line Sa(2) and reading the electrical signals received via the plurality of signal sensing lines SS to determine whether any of the keys among the third key group 30 is triggered, and then performing the second scan procedure (the specific performing content can be as shown in step S222). In addition, the first scan procedure, the fourth scan procedure and the second scan procedure are performed one after another, and each of the secondary scan lines Sb(1) to Sb(N) is triggered at least once. It should be noted that the usage frequency of the first key group 10 is higher than the usage frequency of the third key group 30. The column order of the second main scan line Sa(2) is arranged after the column order of the first main scan line Sa(1). The column order of the plurality of secondary scan lines Sb(1) to Sb(N) is arranged after the column order of the second main scan line Sa(2).

In actual operation, the second embodiment of the present invention can be practically applied to a keyboard with two scan modes, such as an e-sports scan mode (referred to as an e-sports mode for short) and a word processing scan mode (referred to as a word processing mode for short). Similarly, setting the scan mode can be performed by a system with automatic detection and determination. For example, when the system detects that a user has started a game, the system automatically set the scan mode to the first scan mode (e-sports mode). Undoubtedly, the user can also manually perform the setting of the scan mode. Before the step of performing the first scan mode or the third scan mode, the method further includes determining which of the first scan mode and the third scan mode is enabled, that is, which mode is to be performed. When the first scan mode is enabled, the first scan mode is performed. When the third scan mode is enabled, the third scan mode is performed. The third scan mode includes: performing the first scan procedure first; then performing the fourth scan procedure, the fourth scan procedure includes triggering the second main scan line Sa(2) and reading the electrical signals received via the plurality of signal sensing lines SS to determine whether any of the keys among the third key group is triggered; and then performing the second scan procedure, wherein the first scan procedure, the fourth scan procedure and the second scan procedure are performed one after another, and each of the plurality of secondary scan lines is triggered at least once.

Figure 3:
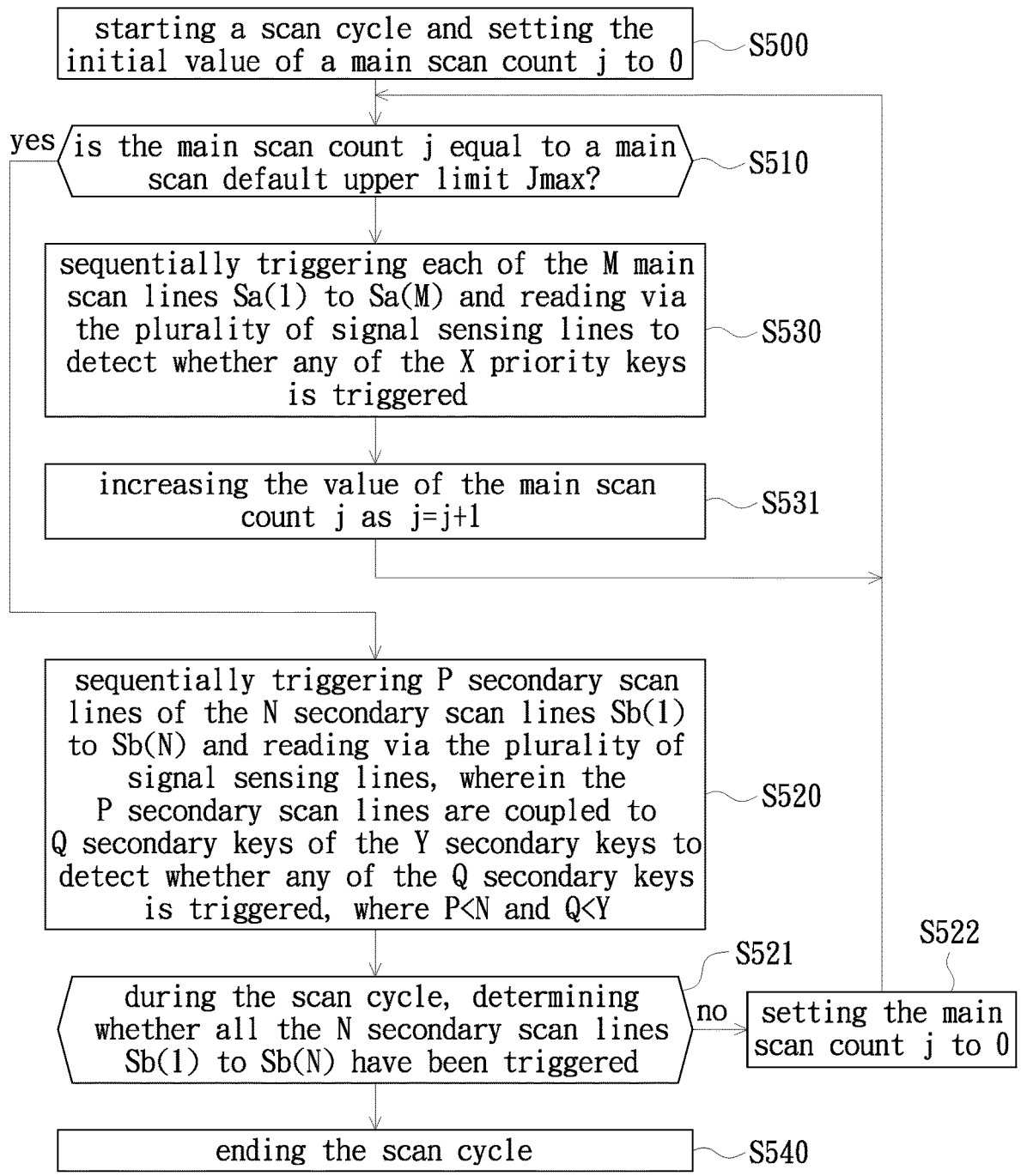
FIG. 3 is a schematic flow diagram illustrating a scan method for a key scan circuit according to a third embodiment of the present invention.

Then, please refer to FIG. 3 and also refer to FIG. 4A to FIG. 5 at the same time to understand the key scanning operation flow. FIG. 3 is a schematic flow diagram illustrating a scan method for a key scan circuit according to a third embodiment of the present invention. It should be noted that, the steps of the scan method for a key scan circuit are very similar to the steps of the key scanning method, and some of the steps are the same. The key scanning method has been described in detail in the aforementioned embodiments. Thus no redundant detail is to be given herein. In the scan method for the key scan circuit 40 of the third embodiment, the key scan circuit 40 is capable of scanning a first key group 10 and a second key group 20. The first key group 10 comprises X priority keys. The second key group 20 comprises Y secondary keys. The key scan circuit 40 comprises M main scan lines Sa(1) to Sa(M), N secondary scan lines Sb(1) to Sb(N) and a plurality of signal sensing lines SS, where X, Y, M and N are positive integers. The M main scan lines Sa(1) to Sa(M) are electrically connected to the X priority keys. The N secondary scan lines Sb(1) to Sb(N) are electrically connected to the Y secondary keys. The scan method comprises following steps: step (1), starting a scan cycle and setting an initial value of a main scan count j to 0 (as shown in step S500); step (2a), determining whether the main scan count j is equal to a main scan default upper limit Jmax (as shown in step S510), where Jmax is a positive integer, performing step (3) if yes, and performing step (2b) if no; step (2b), sequentially triggering each of the M main scan lines Sa(1) to Sa(M) and reading electrical signals received via the plurality of signal sensing lines SS to detect whether any of the X priority keys is triggered (as shown in step S530); step (2c), increasing a value of the main scan count j as j=j+1 (as shown in step S531), and returning to step (2a); step (3), sequentially triggering P secondary scan lines of the N secondary scan lines Sb(1) to Sb(N) and reading the electrical signals received via the plurality of signal sensing lines SS, wherein the P secondary scan lines are coupled to Q secondary keys of the Y secondary keys to detect whether any of the Q secondary keys is triggered, where P<N and Q<Y, and P and Q are positive integers (as shown in step S520); and step (4), during the scan cycle, determining whether all the N secondary scan lines Sb(1) to Sb(N) have been triggered (as shown in step S521), ending the scan cycle(as shown in step S540) if yes, and setting the main scan count j to 0 and returning to step (2a) if no (as shown in step S522).

When the key scan circuit 40 is set to a first scan mode and M equals to 1 (M=1), that is, the key scan circuit has a main scan line defined as a first main scan line Sa(1). All the X priority keys are electrically connected to the first main scan line Sa(1). During the scan cycle, a sequence of sequentially triggering the first main scan line Sa(1) and the N secondary scan lines Sb(1) to Sb(N) can be: scanning Sa(1) Jmax times, for example, scanning Sa(1) 3 times when Jmax is 3; then, sequentially scanning the secondary scan lines Sb(1) to Sb(P), and then scanning Sa(1) Jmax times, then, scanning Sb(1+P) to Sb(2P), and so on until scanning Sa(1) Jmax times and P secondary scan lines and determining that all the N secondary scan lines Sb(1) to Sb(N) have been scanned. In actual operation, the first scan mode can be an e-sports mode, and the X priority keys include at least four English letter keys "W", "A", "S" and "D" and four arrow keys "up", "down", "left" and "right".

For example, when Jmax=1 and P=1, during the scan cycle, the sequence of sequentially triggering the first main scan line Sa(1) and the N secondary scan lines Sb(1) to Sb(N) can be: Sa(1)->Sb(1)->Sa(1)->Sb(2)->Sa(1)->Sb(3), until Sa(1)->Sb(N). In other words, triggering the first main scan line Sa(1), then triggering the secondary scan line Sb(1), then triggering the first main scan line Sa(1), then triggering the secondary scan line Sb(2), then triggering the first main scan line Sa(1), then triggering the secondary scan line Sb(3), and so on, until triggering the first main scan line Sa(1) and then triggering the secondary scan line Sb(N).

For another example, when Jmax=1 and P=2, in the third embodiment, the input device has 6 scan lines including one main scan line and 5 secondary scan lines. During the scan cycle, the sequence of sequentially triggering the first main scan line Sa(1) and the N secondary scan lines Sb(1) to Sb(N) can be: Sa(1)->[Sb(1)->Sb(2)]->Sa(1)->[Sb(3)->Sb(4)] until->Sa(1)->Sb(5). In the third embodiment, P is equal to 2, N is equal to 5, and N cannot be divisible by P. In the last scanning during the scan cycle, only one secondary scan line Sb(5) of the N secondary scan lines Sb(1) to Sb(N), which has not been scanned yet, is chose for scanning. In actual operation, the sequence of the sequentially triggering the first main scan line Sa(1) and the N secondary scan lines Sb(1) to Sb(N) during the scan cycle can also be: Sa(1)->[Sb(1)->Sb(2)]->Sa(1)->[Sb(3)->Sb(4)] until->Sa(1)->[Sb(5)->Sb(1)]. That is, the cycle of the N secondary scan lines Sb(1) to Sb(N) can also be used as the scanning target, thus Sb(5) and Sb(1) can be scanned.

For another example, when Jmax=1 and P=3, the sequence of the sequentially triggering the first main scan line Sa(1) and the N secondary scan lines Sb(1) to Sb(N) during the scan cycle can be: Sa(1)->[Sb(1)->Sb(2)->Sb(3)]->Sa(1)->[Sb(4)->Sb(5)->Sb(6)] until->Sa(1)->[Sb(N−2)->Sb(N−1)->Sb(N)].

For another example, when Jmax=2 and P=1, the sequence of the sequentially triggering the first main scan line Sa(1) and the N secondary scan lines Sb(1) to Sb(N) during the scan cycle can be: [Sa(1)->Sa(1)]->Sb(1)->[Sa(1)->Sa(1)]->Sb(2) until->[Sa(1)->Sa(1)]->Sb(N).

For another example, when Jmax=3 and P=1, the sequence of the sequentially triggering the first main scan line Sa(1) and the N secondary scan lines Sb(1) to Sb(N) during the scan cycle can be: [Sa(1)->Sa(1)->Sa(1)]->Sb(1)->[Sa(1)->Sa(1)->Sa(1)]->Sb(2) until->[Sa(1)->Sa(1)->Sa(1)]->Sb(N). In general, increasing the number of times of scanning the main scan line Sa(1) can greatly shorten the response time of the X priority keys.

When the key scan circuit 40 is set to a second scan mode, M is equal to 2 (M=2), the input device has two main scan lines respectively defined as a first main scan line Sa(1) and a second main scan line Sa(2). The X priority keys are electrically connected to the two main scan lines Sa(1) and Sa(2). During the scan cycle, a sequence of sequentially triggering the two main scan lines Sa(1) and Sa(2) and the N secondary scan lines Sb(1) to Sb(N) can be: loop-scanning Sa(1) to Sa(2) Jmax times->scanning Sb(1) to Sb(P)->loop-scanning Sa(1) to Sa(2) Jmax times->scanning Sb(1+P) to Sb(2P)->loop-scanning Sa(1) to Sa(2) Jmax times until->loop-scanning Sa(1) to Sa(2) Jmax times and scanning P secondary scan lines and determining that all the N secondary scan lines Sb(1) to Sb (N) have been triggered. In actual operation, the second scan mode can be a word processing mode, and the X priority keys include at least 26 English letter keys "A to Z".

For example, when Jmax=1 and P=1, during the scan cycle, the sequence of sequentially triggering the two main scan lines Sa(1) and Sa(2) and the N secondary scan lines Sb(1) to Sb(N) can be: [Sa(1)->Sa(2)]->Sb(1)->[Sa(1)->Sa(2)]->Sb(2)->[Sa(1)->Sa(2)]->Sb(3) until [Sa(1)->Sa(2)]->Sb(N). In other words, first triggering the main scan line Sa(1), then triggering the main scan line Sa(2), then triggering the secondary scan line Sb(1), then triggering the main scan line Sa(1), then triggering the main scan line Sa(2), then triggering the secondary scan line Sb(2), then triggering the main scan line Sa(1), then triggering the main scan line Sa(2), then triggering the secondary scan line Sb(3), and so on, until triggering the first main scan line Sa(1), then triggering the second main scan line Sa(2), and then triggering the secondary scan line Sb(N). In general, increasing the number of times of scanning the main scan lines Sa(1) and Sa(2) can greatly improved the response time of the X priority keys.

Next, it is to be explained that the key scanning method and the scan method for the key scan circuit provided by the embodiments of the present invention can be performed in an input device 1. Please refer to FIG. 1 to FIG. 4C at the same time. However, the present invention does not limit the key scanning method of FIG. 1 to FIG. 2 and the scan method for a key scan circuit of FIG. 3 to be performed only in the input device 1 of FIG. 5. It is noted that, since the step flow of the key scanning method and the scan method for the key scan circuit have been described in detail in the aforementioned embodiments, no redundant detail is to be given herein.

The input device 1 includes a key scan circuit 40, a first key group 10 and a second key group 20. In actual operation, the input device 1 can be a physical keyboard. The keyboard has a plurality of keys, and each key is marked with the character and symbol it represents. In most cases, pressing a key will output a corresponding symbol, such as a letter, a number, or a punctuation mark. The key scan circuit 40 includes M main scan lines Sa(1) to Sa(M), N secondary scan lines Sb(1) to Sb(N) and a plurality of signal sensing lines SS, where M and N are positive integers. The first key group 10 includes X priority keys. The M main scan lines Sa(1) to Sa(M) are electrically connected to the X priority keys, where X is a positive integer. For example, when M=1, that is, the key scan circuit 40 has only one main scan line, which can be defined as a first main scan line Sa(1). The X priority keys include at least four English letter keys "W", "A", "S" and "D" and four arrow keys "up", "down", "left" and "right". In this case, the X priority keys are electrically connected to the first main scan line Sa(1). In another case, when M=2, the key scan circuit 40 has two main scan lines. The two main scan lines can be respectively defined as a first main scan line Sa(1) and a second main scan line Sa(2). The X priority keys include at least 26 English letter keys "A to Z". In this case, the X priority keys are electrically connected to the two main scan lines Sa(1) and Sa(2). The second key group 20 includes Y secondary keys. The N secondary scan lines Sb(1) to Sb(N) are electrically connected to the Y secondary keys, where Y is a positive integer.

Please refer to FIG. 3, the key scan circuit 40 of the input device 1 of the present invention can perform the following steps: step (1), starting a scan cycle and setting an initial value of a main scan count j to 0 (as shown in step S500); step (2a), determining whether the main scan count j is equal to a main scan default upper limit Jmax (as shown in step S510), where Jmax is a positive integer, performing step (3) if yes, and performing step (2b) if no; step (2b), sequentially triggering each of the M main scan lines Sa(1) to Sa(M) and reading electrical signals received via the plurality of signal sensing lines SS to detect whether any of the X priority keys is triggered (as shown in step S530); step (2c), increasing a value of the main scan count j as j=j+1 (as shown in step S531), and returning to step (2a); step (3), sequentially triggering P secondary scan lines of the N secondary scan lines Sb(1) to Sb(N) and reading the electrical signals received via the plurality of signal sensing lines SS, wherein the P secondary scan lines are coupled to Q secondary keys of the Y secondary keys, so as to detect whether any of the Q secondary keys is triggered, where P<N and Q<Y, and P and Q are positive integers (as shown in step S520); and step (4), during the scan cycle, determining whether all the N secondary scan lines Sb(1) to Sb(N) have been triggered (as shown in step S521), setting the main scan count j to 0 and returning to step (2a) if no, and ending the scan cycle (as shown in step S540) if yes.

When key scan circuit 40 is not set to a first scan mode and M=1, that is, the input device has a main scan line defined as a first main scan line Sa(1). Jmax=1 and P=N. During the scan cycle, the sequence of sequentially triggering the first main scan line Sa(1) and the N secondary scan lines Sb(1) to Sb(N) can be: Sa(1)->Sb(1)->Sb(2)->Sb(3) until Sb(N), so that the first main scan line Sa(1) and each of the N secondary scan lines Sb(1) to Sb(N) are triggered a same number of times. For another example, when Jmax=1 and P=1, During the scan cycle, the sequence of sequentially triggering the first main scan line Sa(1) and the N secondary scan lines Sb(1) to Sb(N) can be: Sa(1)->Sb(1)->Sa(1)->Sb(2)->Sa(1)->Sb(3) until Sb(N), so that a number of times that the first main scan line Sa(1) is triggered is larger than a number of times that each of the N secondary scan lines Sb(1) to Sb(N) is triggered.

When the key scan circuit 40 is set to the first scan mode, and Jmax>=1 and P<N, during the scan cycle, the sequence of sequentially triggering the first main scan line Sa(1) and the N secondary scan lines Sb(1) to Sb(N) can be: scanning Sa(1) Jmax times->scanning [Sb(1) to Sb(P)]->scanning Sa(1) Jmax times->scanning [Sb(P+1) to Sb(2P)], until scanning Sa(1) Jmax times and scanning P secondary scan lines and determining that all the N secondary scan lines Sb(1) to Sb(N) have been scanned, so that a number of times that the first main scan line Sa(1) is triggered is larger than a number of times that each of the N secondary scan lines Sb(1) to Sb(N) is triggered.

When the key scan circuit 40 is not set to a second scan mode and M is equal to 2(M=2), that is, the key scan circuit has two main scan lines respectively defined as a first main scan line Sa(1) and a second main scan line Sa(2), where Jmax=1 and P=N. During the scan cycle, a sequence of sequentially triggering the two main scan lines Sa(1) and Sa(2) and the N secondary scan lines Sb(1) to Sb(N) can be: Sa(1)->Sa(2)->Sb(1)->Sb(2)->Sb(3) until Sb(N), so that each of the two main scan lines Sa(1) and Sa(2) and each of the N secondary scan lines Sb(1) to Sb(N) are triggered a same number of times. For another example, when Jmax=1 and P=1, during the scan cycle, a sequence of sequentially triggering the two main scan lines Sa(1) and Sa(2) and the N secondary scan lines Sb(1) to Sb(N) can be: [Sa(1)->Sa(2)]->Sb(1)->[Sa(1)->Sa(2)]->Sb(2)->[Sa(1)->Sa(2)]->Sb(3) until [Sa(1)->Sa(2)]->Sb(N), so that a number of times that each of the two first main scan lines Sa(1) and Sa(2) is triggered is larger than a number of times that each of the N secondary scan lines Sb(1) to Sb(N) is triggered.

When the key scan circuit 40 is set to the second scan mode and Jmax>=1 and P<N, during the scan cycle, a sequence of sequentially triggering the two main scan lines Sa(1) and Sa(2) and the N secondary scan lines Sb(1) to Sb(N) one after another can be: loop-scanning [Sa(1)->Sa(2)] Jmax times->scanning [Sb(1)->Sb(2)-> . . . Sb(P)] once->loop-scanning [Sa(1)->Sa(2)] Jmax times->scanning [Sb(P+1) . . . Sb(2P)] once, until loop-scanning [Sa(1)->Sa(2)] Jmax times and scanning P secondary scan lines and determining that all the N secondary scan lines Sb(1) to Sb(N) are scanned. Therefore, a number of times that each of the two main scan lines Sa(1) to Sa(2) is triggered is larger than a number of times that each of the N secondary scan lines Sb(1) to Sb(N) is triggered.

Figure 7A:
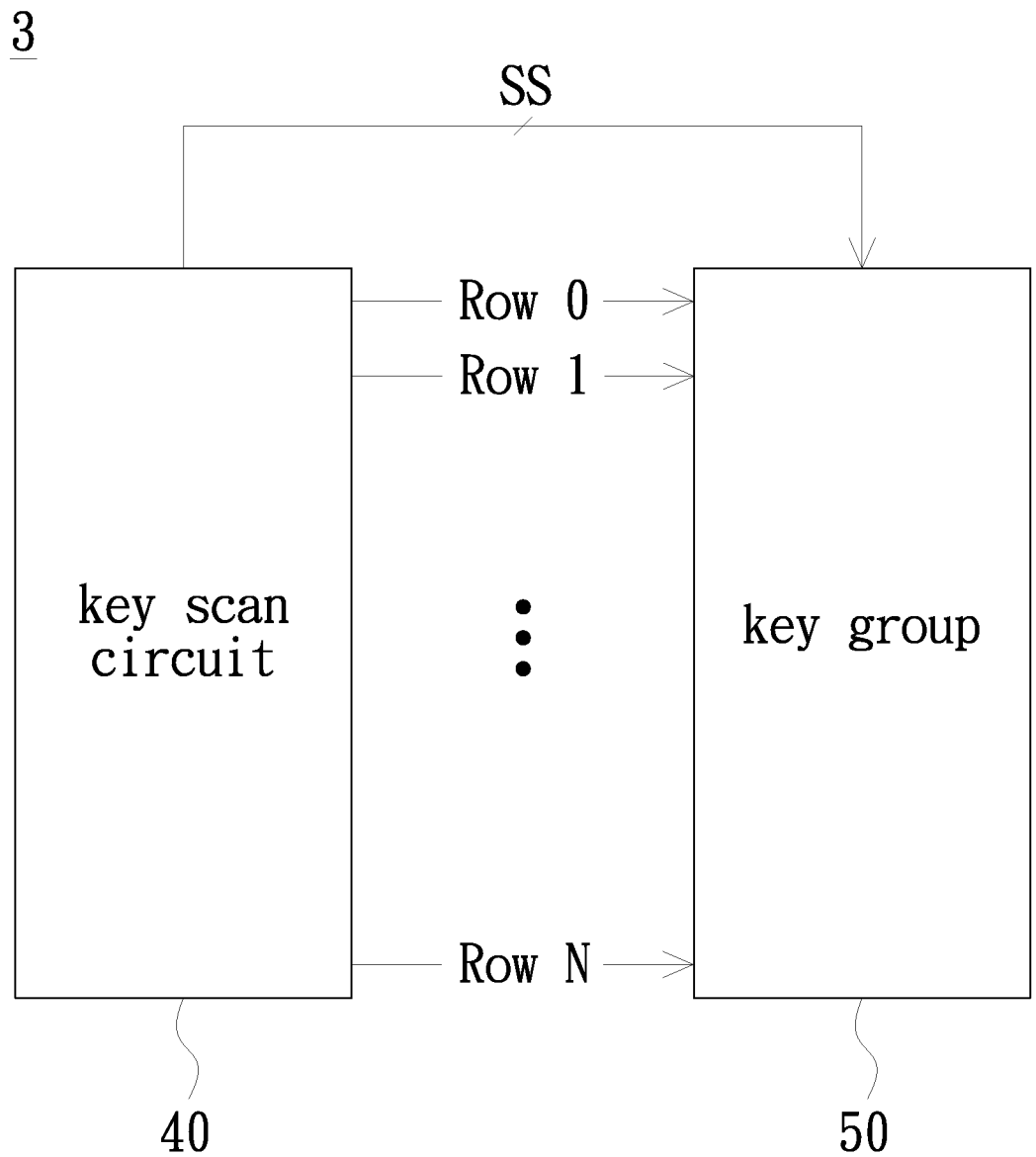
FIG. 7A is a schematic block diagram of another keyboard input device adapted to a first scan mode according to a fourth embodiment of the present invention.
Figure 7B:
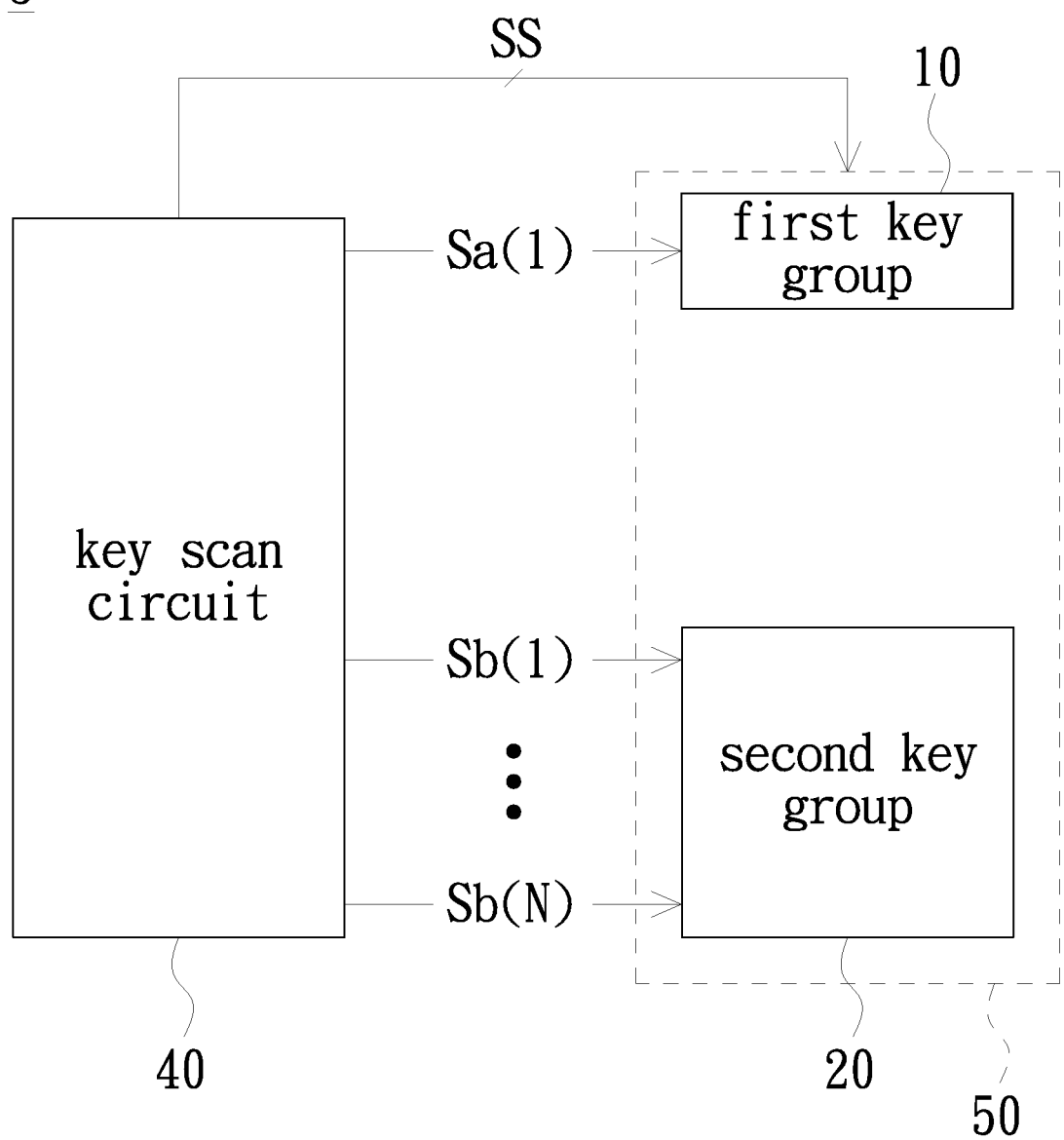
FIG. 7B is a schematic block diagram of the keyboard input device adapted to a second scan mode according to the fourth embodiment of the present invention.
Figure 7C:
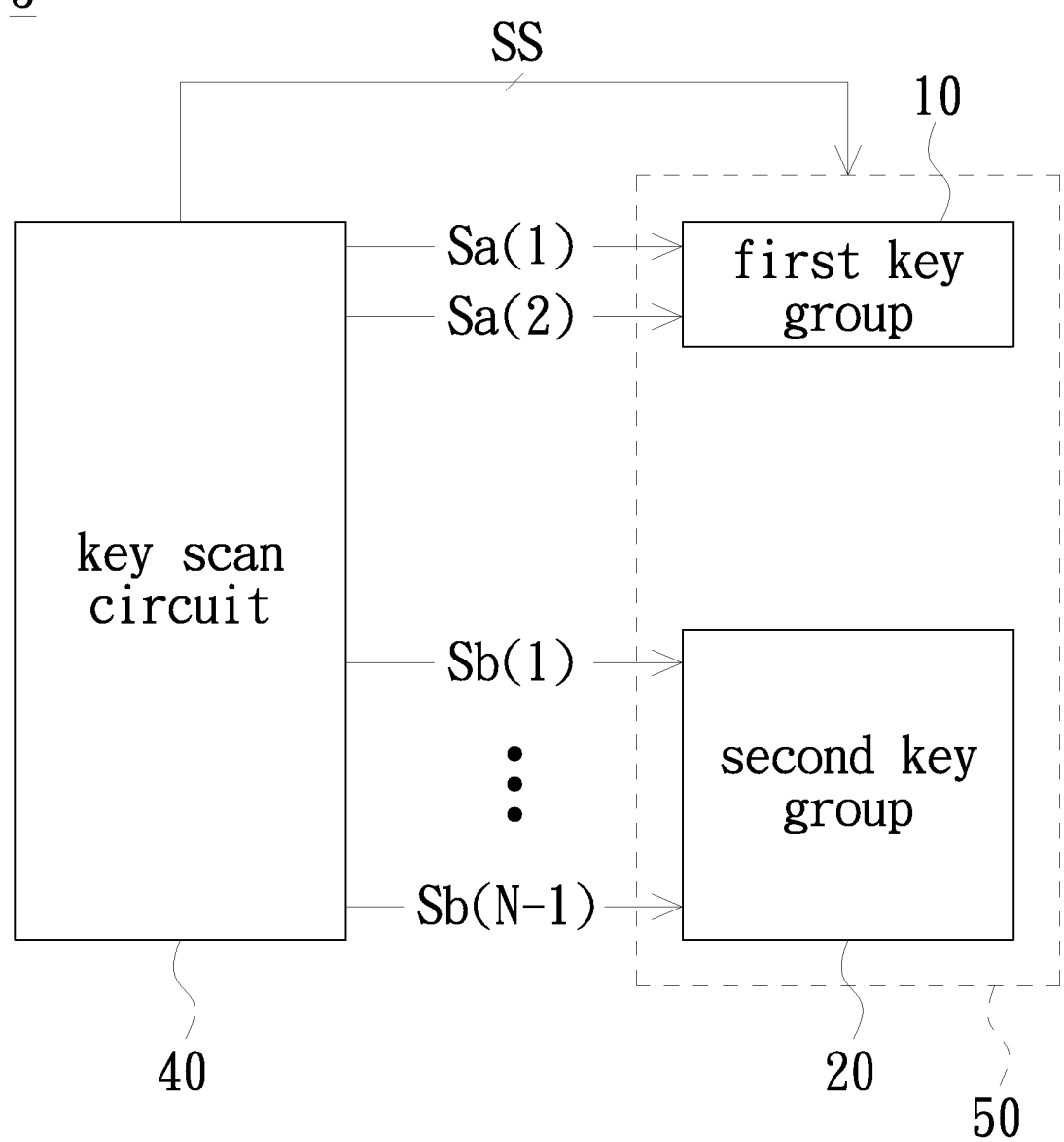
FIG. 7C is a schematic block diagram of the keyboard input device adapted to a third scan mode according to the fourth embodiment of the present invention.

It is to be explained hereinafter that the key scanning method and the scan method for a key scan circuit provided by the embodiments of the present invention can be performed in an input device 3. Please refer to FIG. 1 to FIG. 4C at the same time. However, the present invention does not limit the key scanning method of FIG. 1 and FIG. 2 and the scan method for the key scan circuit of FIG. 3 to only be performed in the input device 3 of FIG. 7A to FIG. 7C. FIG. 7A is a schematic block diagram of the keyboard input device 3 adapted to a first scan mode according to a fourth embodiment of the present invention. FIG. 7B is a schematic block diagram of the keyboard input device 3 adapted to a second scan mode according to the fourth embodiment of the present invention. FIG. 7C is a schematic block diagram of the keyboard input device 3 adapted to a third scan mode according to the fourth embodiment of the present invention. It should be noted that, since the step flow of the key scanning method and the scan method for a key scan circuit have been described in detail in the aforementioned embodiments, no redundant detail is to be given herein.

The input device 3 includes a key scan circuit 40 and a key group 50. The key group 50 can include a first key group 10 and a second key group 20. The input device 3 can be a physical keyboard. The keyboard has a plurality of keys, and each key is marked with the character and symbol it represents. In most cases, pressing a key will output a corresponding symbol, such as a letter, a number, or a punctuation mark. The key scan circuit 40 includes N+1 scan lines Row 0 to Row N and a plurality of signal sensing lines SS, where N is a positive integer.

Figure 8:
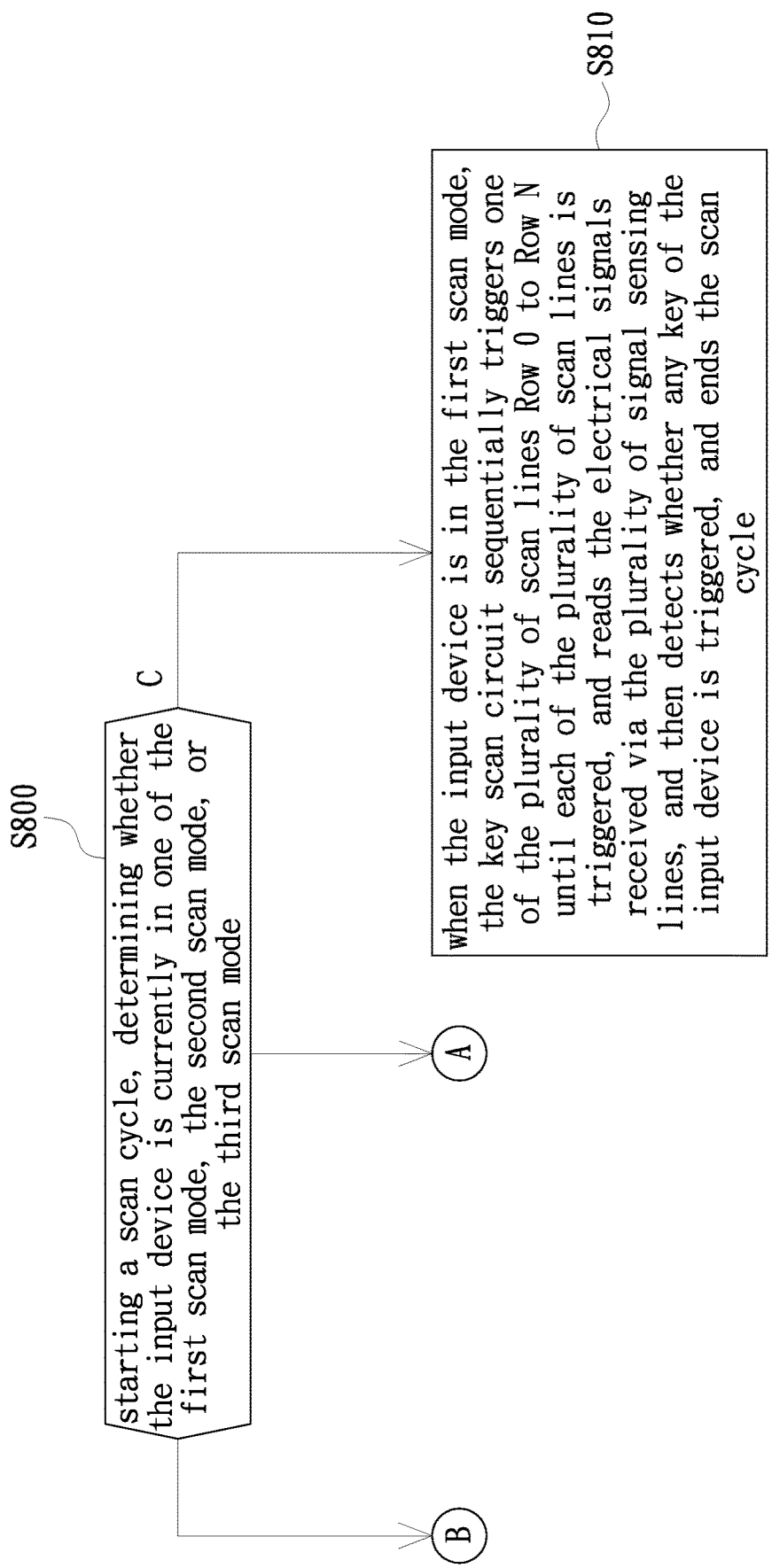
FIG. 8 is a schematic flow diagram illustrating a key scanning method performing a first scan mode according to a fifth embodiment of the present invention.
Figure 9:
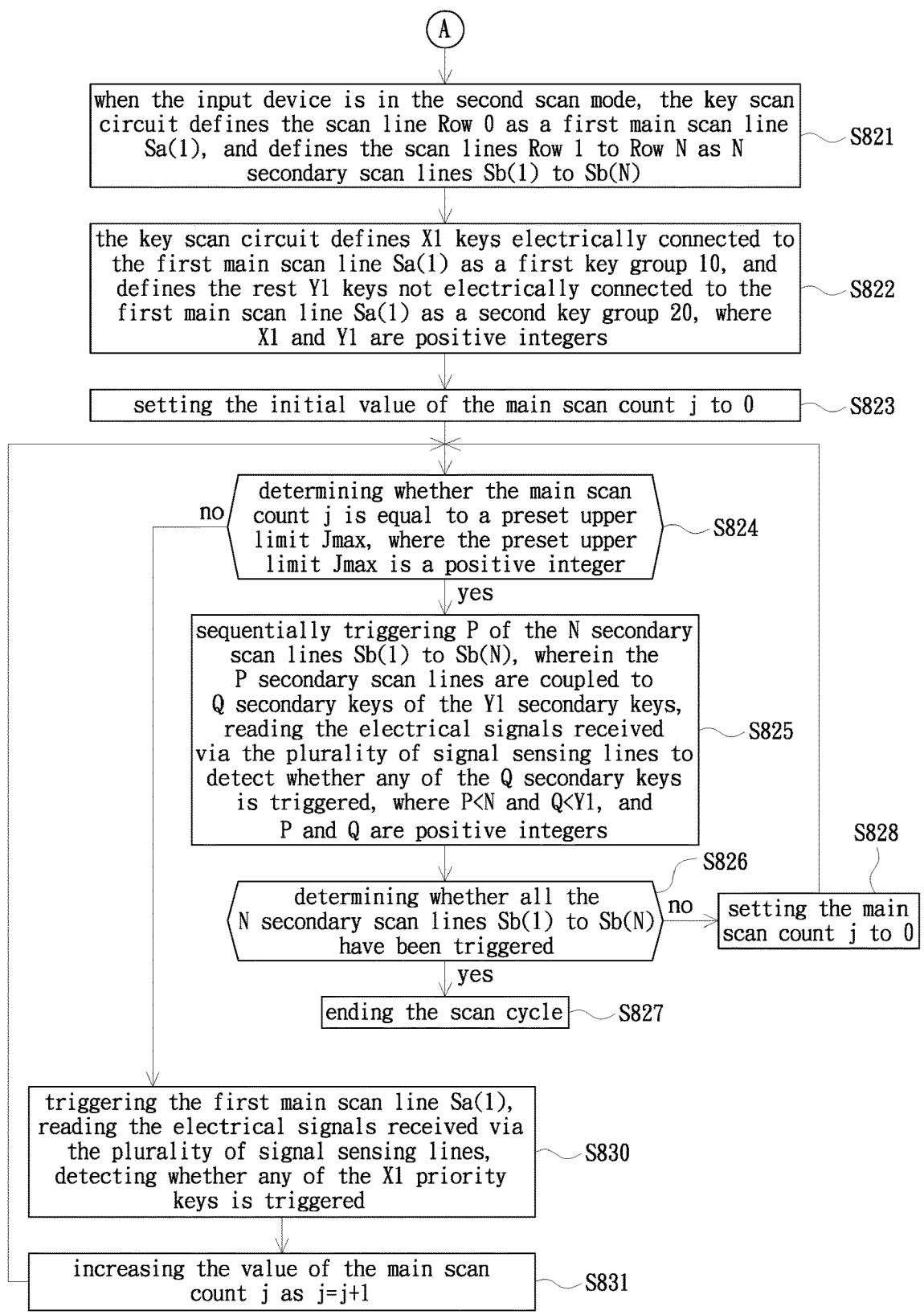
FIG. 9 is a schematic flow diagram illustrating the key scanning method performing a second scan mode according to the fifth embodiment of the present invention.
Figure 10:
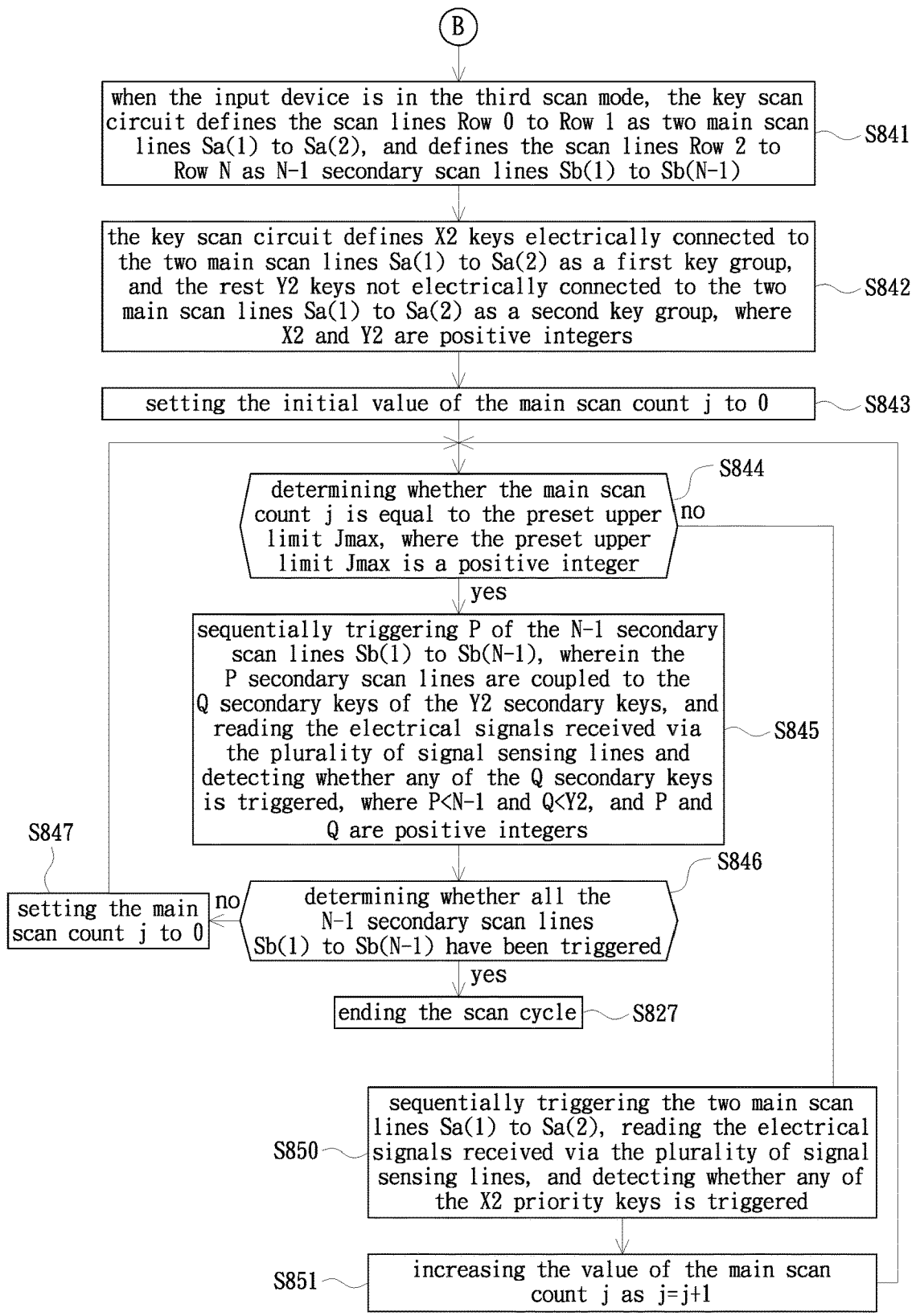
FIG. 10 is a schematic flow diagram illustrating the key scanning method performing a third scan mode according to the fifth embodiment of the present invention.

Please refer to FIG. 8 to FIG. 10. FIG. 8 to FIG. 10 are schematic flow diagrams of performing a key scanning method according to a fifth embodiment of the present invention. As shown in step S800 in FIG. 8, the key scan circuit 40 performs the following steps: starting a scan cycle, determining whether the input device 3 is currently in one of the first scan mode, the second scan mode, or the third scan mode, and accordingly performing one of step S810 (path C, corresponding to the first scan mode), step S821 (path A, corresponding to the second scan mode), or step S841 (path B, corresponding to the third scan mode). It should be noted that in actual operation, the first scan mode can be a normal mode, the second scan mode can be an e-sports mode, and the third scan mode can be a word processing mode.

As shown in step S810 in FIG. 8, when the input device 3 is in the first scan mode, the following steps are performed. First, the key scan circuit 40 sequentially triggers one of the plurality of scan lines Row 0 to Row N until each of the plurality of scan lines is triggered, and reads the electrical signals received via the plurality of signal sensing lines SS, and then detects whether any key of the input device 3 is triggered, and ends the scan cycle.

As shown in step S821 in FIG. 9, when the input device 3 is in the second scan mode, the key scan circuit 40 defines the scan line Row 0 as a first main scan line Sa(1), and defines the scan lines Row 1 to Row N as N secondary scan lines Sb(1) to Sb(N). Next, the key scan circuit 40 defines X1 keys electrically connected to the first main scan line Sa(1) as a first key group 10, and defines the rest Y1 keys not electrically connected to the first main scan line Sa(1) as a second key group 20, where X1 and Y1 are positive integers (as shown in step S822). It should be noted that the X1 priority keys include at least the four English letter keys "W", "A", "S" and "D" and four arrow keys "up", "down", "left" and "right". Next, the initial value of the main scan count j is set to 0 (as shown in step S823). Then, determining whether the main scan count j is equal to a preset upper limit Jmax, where the preset upper limit Jmax is a positive integer (as shown in step S824), performing step S825 if yes, and performing step S830 if no.

What is to be explained next is the step flow when the main scan count j is equal to the preset upper limit Jmax. First, sequentially triggering P of the N secondary scan lines Sb(1) to Sb(N), wherein the P secondary scan lines are coupled to Q secondary keys of the Y1 secondary keys. Next, reading the electrical signals received via the plurality of signal sensing lines SS to detect whether any of the Q secondary keys is triggered, where P<N and Q<Y1, and P and Q are positive integers (as shown in step S825). Next, determining whether all the N secondary scan lines Sb(1) to Sb(N) have been triggered (as shown in step S826), setting the main scan count j to 0 and returning to step S824 (as shown in step S828) if no, and ending the scan cycle (as shown in step S827) if yes.

What is to be explained next is the step flow when the main scan count j is not equal to the preset upper limit Jmax. First, triggering the first main scan line Sa(1), reading the electrical signals received via the plurality of signal sensing lines SS, and detecting whether any of the X1 priority keys is triggered (as shown in step S830). Next, increasing the value of the main scan count j as j=j+1, and returning to step S824 (as shown in step S831).

As shown in step S841 in FIG. 10, when the input device 3 is in the third scan mode, the key scan circuit 40 defines the scan lines Row 0 to Row 1 as two main scan lines Sa(1) to Sa(2), and defines the scan lines Row 2 to Row N as N−1 secondary scan lines Sb(1) to Sb(N−1). Next, the key scan circuit 40 defines X2 keys electrically connected to the two main scan lines Sa(1) to Sa(2) as a first key group, and the rest Y2 keys not electrically connected to the two main scan lines Sa(1) to Sa(2) as a second key group, where X2 and Y2 are positive integers (as shown in step S842). It should be noted that the X2 priority keys include at least the 26 English letter keys "A to Z" and four arrow keys "up", "down", "left" and "right". Next, setting the initial value of the main scan count j to 0 (as shown in step S843). Then, determining whether the main scan count j is equal to the preset upper limit Jmax, where the preset upper limit Jmax is a positive integer (as shown in step S844), performing step S845 if yes, and performing step S850 if no.

What is to be explained next is the step flow when the main scan count j is equal to the preset upper limit Jmax. First, sequentially triggering P of the N−1 secondary scan lines Sb(1) to Sb(N−1), wherein the P secondary scan lines are coupled to the Q secondary keys of the Y2 secondary keys, and reading the electrical signals received via the plurality of signal sensing lines SS and detecting whether any of the Q secondary keys is triggered, where P<N−1 and Q<Y2, and P and Q are positive integers (as shown in step S845). Next, determining whether all the N−1 secondary scan lines Sb(1) to Sb(N−1) have been triggered (as shown in step S846), setting the main scan count j to 0, and returning to step S844 (as shown in step S847) if no, and ending the scan cycle (as shown in step S827) if yes.

What is to be explained next is the step flow when the main scan count j is not equal to the preset upper limit Jmax. First, sequentially triggering the two main scan lines Sa(1) to Sa(2), reading the electrical signals received via the plurality of signal sensing lines SS, and detecting whether any of the X2 priority keys is triggered (as shown in step S850). Next, increasing the value of the main scan count j as j=j+1, and returning to step S844 (as shown in step S851).

In summary, in the key scanning method, the scan method for the key scan circuit, and the input device provided by the embodiments of the present invention, the scan cycle of these crucial keys is shortened by interspersedly or alternately scanning the crucial keys or the commonly used keys, which increases the number of times of scanning the main scan lines coupled to the crucial keys, so that the crucial keys can be scanned faster. Therefore, the scanning cycle of the crucial keys is greatly shortened, and the response time of the crucial keys is shortened.

The detail description of the aforementioned preferred embodiments is for clarifying the feature and the spirit of the present invention, rather than limiting the scope of the present invention by any of the disclosed preferred embodiments described herein. On the contrary, it is intended to cover various modifications and similar arrangements included within the scope of the appended claims. Therefore, the scope of the claims is to be accorded with the broadest interpretation so as to encompass all such modifications and similar arrangements.

What is claimed is:

1. A key scanning method, adapted to an input device having a plurality of keys, wherein the input device further has a plurality of scan lines for scanning the plurality of keys and has a plurality of signal sensing lines corresponding to the plurality of keys, and the plurality of scan lines comprise a first main scan line and a plurality of secondary scan lines, wherein the first main scan line is electrically connected to a first key group among the plurality of keys, and the plurality of secondary scan lines are electrically connected to a second key group among the plurality of keys, the key scanning method comprising:

performing a first scan mode, wherein the first scan mode comprises:

performing a first scan procedure, wherein the first scan procedure comprises triggering the first main scan line and reading electrical signals received via the plurality of signal sensing lines to determine whether any of the keys among the first key group is triggered; and performing a second scan procedure, wherein the second scan procedure comprises triggering at least a non-triggered one of the plurality of secondary scan lines and reading the electrical signals received via the plurality of signal sensing lines to determine whether any of the keys among the second key group is triggered, wherein at least a next one of the secondary scan lines is non-triggered;

wherein the first scan procedure and the second scan procedure are performed one after another for multiple times, until each of the plurality of secondary scan lines is triggered at least once to complete one scan cycle.

2. The key scanning method according to claim 1, wherein a configuration of the plurality of keys is a matrix composed of R rows and C columns, where R and C are positive integers greater than or equal to 2.

3. The key scanning method according to claim 2, wherein column orders of the plurality of secondary scan lines are arranged after a column order of the first main scan line, and the plurality of signal sensing lines are disposed corresponding to a first column to a Cth column of the matrix.

4. The key scanning method according to claim 1 further comprising performing a second scan mode, wherein before the step of performing the first scan mode or the step of performing the second scan mode, the key scanning method further comprising:

determining which of the first scan mode and the second scan mode is enabled;

performing the first scan mode when the first scan mode is enabled; and performing the second scan mode when the second scan mode is enabled, wherein the second scan mode comprises performing the first scan procedure and a third scan procedure one after another, and the third scan procedure comprises sequentially triggering the plurality of secondary scan lines and reading the electrical signals received via the plurality of secondary scan lines to determine whether any of the keys among the second key group is triggered.

5. The key scanning method according to claim 4, wherein the plurality of scan lines for scanning the plurality of keys further comprise a second main scan line, the second main scan line is electrically connected to a third key group among the plurality of keys, and the key scanning method further comprises performing a third scan mode, wherein before the step of performing the first scan mode, the step of performing the second scan mode, or the step of performing the third scan mode, the key scanning method further comprising:
determining which of the first scan mode, the second scan mode and the third scan mode is enabled; and
performing the third scan mode when the third scan mode is enabled, wherein the third scan mode comprises:
performing the first scan procedure;
performing a fourth scan procedure, wherein the fourth scan procedure comprises triggering the second main scan line and reading the electrical signals received via the plurality of signal sensing lines to determine whether any of the keys among the third key group is triggered; and
performing the second scan procedure,
wherein the first scan procedure, the fourth scan procedure and the second scan procedure are performed one after another, and each of the plurality of secondary scan lines is triggered at least once.

6. The key scanning method according to claim 5, wherein a usage frequency of the first key group is higher than a usage frequency of the third key group.

7. The key scanning method according to claim 5, wherein a column order of the second main scan line is arranged after a column order of the first main scan line, and column orders of the plurality of secondary scan lines are arranged after the column order of the second main scan line.

8. The key scanning method according to claim 1, wherein the plurality of scan lines for scanning the plurality of keys further comprises a second main scan line, and the second main scan line is electrically connected to a third key group among the plurality of keys,
wherein the key scanning method further comprises performing a third scan mode, before the step of performing the first scan mode or the step of performing the third scan mode, the key scanning method further comprising:
determining which of the first scan mode and the third scan mode is enabled;
performing the first scan mode when the first scan mode is enabled; and
performing the third scan mode when the third scan mode is enabled,
wherein the third scan mode comprises:
performing the first scan procedure;
performing a fourth scan procedure, wherein the fourth scan procedure comprises triggering the second main scan line and reading the electrical signals received via the plurality of signal sensing lines to determine whether any of the keys among the third key group is triggered; and
performing the second scan procedure,
wherein the first scan procedure, the fourth scan procedure and the second scan procedure are performed one after another, and each of the plurality of secondary scan lines is triggered at least once.

9. The key scanning method according to claim 8, wherein a usage frequency of the first key group is higher than a usage frequency of the third key group.

10. The key scanning method according to claim 8, wherein a column order of the second main scan line is arranged after a column order of the first main scan line, and column orders of the plurality of secondary scan lines are arranged after the column order of the second main scan line.

11. A scan method for a key scan circuit capable of scanning a first key group and a second key group, wherein the first key group comprises X priority keys, the second key group comprises Y secondary keys, and the key scan circuit comprises M main scan lines Sa(1) to Sa(M), N secondary scan lines Sb(1) to Sb(N) and a plurality of signal sensing lines, where X, Y, M and N are positive integers, wherein the M main scan lines Sa(1) to Sa(M) are electrically connected to the X priority keys, and the N secondary scan lines Sb(1) to Sb(N) are electrically connected to the Y secondary keys, the scan method comprising:
step (1), starting a scan cycle and setting an initial value of a main scan count j to 0;
step (2a), determining whether the main scan count j is equal to a main scan default upper limit Jmax, where Jmax is a positive integer, performing step (3) if yes, and performing step (2b) if no;
step (2b), sequentially triggering each of the M main scan lines Sa(1) to Sa(M) and reading electrical signals received via the plurality of signal sensing lines to detect whether any of the X priority keys is triggered;
step (2c), increasing a value of the main scan count j as j=j+1, and returning to step (2a);
step (3), sequentially triggering non-triggered P secondary scan lines of the N secondary scan lines Sb(1) to Sb(N) and reading the electrical signals received via the plurality of signal sensing lines, wherein the P secondary scan lines are coupled to Q secondary keys of the Y secondary keys to detect whether any of the Q secondary keys is triggered, where P<N and Q<Y, and P and Q are positive integers, wherein at least a next one of the secondary scan lines is non-triggered; and
step (4), during the scan cycle, determining whether all the N secondary scan lines Sb(1) to Sb(N) have been triggered, ending the scan cycle if yes, and setting the main scan count j to 0 and returning to step (2a) if no;
wherein step (2b) and step (3) are performed one after another for multiple times, until each of the N secondary scan lines is triggered at least once to complete the scan cycle.

12. The scan method according to claim 11, wherein when the key scan circuit is set to a first scan mode and M=1, the key scan circuit has a main scan line defined as a first main scan line Sa(1), all the X priority keys are electrically connected to the first main scan line Sa(1), and during the scan cycle, a sequence of sequentially triggering the first main scan line Sa(1) and the N secondary scan lines Sb(1) to Sb(N) is: scanning Sa(1) Jmax times->sequentially scanning Sb(1) to Sb(P) once->scanning Sa(1) Jmax times->scanning Sb(1+P) to Sb(2P) once, until all the N secondary scan lines Sb(1) to Sb(N) have been scanned.

13. The scan method according to claim 12, wherein when Jmax=1 and P=1, during the scan cycle, the sequence of sequentially triggering the first main scan line Sa(1) and the N secondary scan lines Sb(1) to Sb(N) is: Sa(1)->Sb(1)->Sa(1)->Sb(2)->Sa(1)->Sb(3) until step Sa(1)->Sb(N).

14. The scan method according to claim 12, wherein the first scan mode is an electronic sports mode, and the X priority keys comprise at least four English letter keys "W", "A", "S" and "D" and four arrow keys "up", "down", "left" and "right".

15. The scan method according to claim 11, wherein when the key scan circuit is set to a second scan mode and M=2, the key scan circuit has two main scan lines, the two main scan lines are respectively a first main scan line Sa(1) and a second main scan line Sa(2), the X priority keys are electrically connected to the two main scan lines Sa(1) and Sa(2), and during the scan cycle, a sequence of sequentially triggering the two main scan lines Sa(1) and Sa(2) and the N secondary scan lines Sb(1) to Sb(N) is: loop-scanning Sa(1) to Sa(2) Jmax times->scanning Sb(1) to Sb(P) once->loop-scanning Sa(1) to Sa(2) Jmax times->scanning Sb(1+P) to Sb(2P) once->loop-scanning Sa(1) to Sa(2) Jmax times->scanning Sb(1+2P) to Sb(3P) once, until all the N secondary scan lines Sb(1) to Sb (N) have been scanned.

16. The scan method according to claim 15, wherein when Jmax=1 and P=1, during the scan cycle, the sequence of sequentially triggering the two main scan lines Sa(1) and Sa(2) and the N secondary scan lines Sb(1) to Sb(N) is: Sa(1)->Sa(2)->Sb(1)->Sa(1)->Sa(2)->Sb(2)->Sa(1)->Sa(2)->Sb(3), until step [Sa(1)->Sa(2)->Sb(N)].

17. The scan method according to claim 16, wherein the second scan mode is a word processing mode and the X priority keys comprise at least 26 English letter keys "A to Z".

18. An input device, comprising:
a key scan circuit, comprising M main scan lines Sa(1) to Sa(M), N secondary scan lines Sb(1) to Sb(N), and a plurality of signal sensing lines, where M and N are positive integers;
a first key group, comprising X priority keys, wherein the M main scan lines Sa(1) to Sa(M) are electrically connected to the X priority keys, where X is a positive integer; and
a second key group, comprising Y secondary keys, wherein the N secondary scan lines Sb(1) to Sb(N) are electrically connected to the Y secondary keys, where Y is a positive integer;
wherein the key scan circuit performs the following steps:
step (1), starting a scan cycle and setting an initial value of a main scan count j to 0;
step (2a), determining whether the main scan count j is equal to a main scan default upper limit Jmax, where Jmax is a positive integer, performing step (3) if yes, and performing step (2b) if no;
step (2b), sequentially triggering each of the M main scan lines Sa(1) to Sa(M) and reading electrical signals received via the plurality of signal sensing lines to detect whether any of the X priority keys is triggered;
step (2c), increasing a value of the main scan count j as j=j+1, and returning to step (2a);
step (3), sequentially triggering non-triggered P secondary scan lines of the N secondary scan lines Sb(1) to Sb(N) and reading the electrical signals received via the plurality of signal sensing lines, wherein the P secondary scan lines are coupled to Q secondary keys among the Y secondary keys to detect whether any of the Q secondary keys is triggered, where P<N and Q<Y, P and Q are positive integers, wherein at least a next one of the secondary scan lines is non-triggered; and
step (4), during the scan cycle, determining whether all the N secondary scan lines Sb(1) to Sb(N) have been triggered, ending the scan cycle if yes, and setting the main scan count j to 0 and returning to step (2a) if no;
wherein step (2b) and step (3) are performed one after another for multiple times, until each of the N secondary scan lines is triggered at least once to complete the scan cycle.

19. The input device according to claim 18, wherein M=1, the key scan circuit has a main scan line defined as a first main scan line Sa(1), the X priority keys comprise at least four English letter keys "W", "A", "S" and "D" and four arrow keys "up", "down", "left" and "right", and the X priority keys are electrically connected to the first main scan line Sa(1);
wherein when the key scan circuit is not set to a first scan mode, Jmax=1 and P=N, during the scan cycle, the sequence of sequentially triggering the first main scan line Sa(1) and the N secondary scan lines Sb(1) to Sb(N) is: Sa(1)->Sb(1)->Sb(2)->Sb(3) until Sb(N), and the first main scan line Sa(1) and each of the N secondary scan lines Sb(1) to Sb(N) are triggered a same number of times;
wherein when the key scan circuit is set to the first scan mode, Jmax>=1 and P<N, during the scan cycle, the sequence of sequentially triggering the first main scan line Sa(1) and the N secondary scan lines Sb(1) to Sb(N) is: scanning Sa(1) Jmax times->scanning Sb(1) to Sb(P) once->scanning Sa(1) Jmax times->scanning Sb(P+1) to Sb(2P) once, until all the N secondary scan lines Sb(1) to Sb(N) have been scanned, and a number of times that the first main scan line Sa(1) is triggered is larger than a number of times that each of the N secondary scan lines Sb(1) to Sb(N) is triggered.

20. The input device according to claim 19, wherein when Jmax=1 and P=1, during the scan cycle, the sequence of sequentially triggering the first main scan line Sa(1) and the N secondary scan lines Sb(1) to Sb(N) is: Sa(1)->Sb(1)->Sa(1)->Sb(2)->Sa(1)->Sb(3) until step [Sa(1)->Sb(N)].

21. The input device according to claim 18, wherein M=2, the key scan circuit has two main scan lines, the two main scan lines are respectively a first main scan line Sa(1) and a second main scan line Sa(2), the X priority keys comprise at least 26 English letter keys "A to Z", and the X priority keys are electrically connected to the two main scan lines Sa(1) and Sa(2),
wherein when the key scan circuit is not set to a second scan mode, Jmax=1 and P=N, during the scan cycle, a sequence of sequentially triggering the two main scan lines Sa(1) and Sa(2) and the N secondary scan lines Sb(1) to Sb(N) is: Sa(1)->Sa(2)->Sb(1)->Sb(2)->Sb(3) until Sb(N), and each of the two main scan lines Sa(1) and Sa(2) and each of the N secondary scan lines Sb(1) to Sb(N) are triggered a same number of times;
wherein when the key scan circuit is set to the second scan mode, Jmax>=1 and P<N, during the scan cycle, a sequence of sequentially triggering the two main scan lines Sa(1) and Sa(2) and the N secondary scan lines Sb(1) to Sb(N) one after another is: loop-scanning Sa(1) to Sa(2) Jmax times->scanning Sb(1) to Sb(P) once->loop-scanning Sa(1) to Sa(2) Jmax times->scanning Sb(P+1) to Sb(2P) once until all the N secondary scan lines Sb(1) to Sb(N) are scanned, and a number of times that each of the two main scan lines Sa(1) to Sa(2) is triggered is larger than a number of times that each of the N secondary scan lines Sb(1) to Sb(N) is triggered.

22. The input device according to claim 19, wherein when Jmax=1 and P=1, during the scan cycle, the sequence of sequentially triggering the two main scan lines Sa(1) and Sa(2) and the N secondary scan lines Sb(1) to Sb(N) is: Sa(1)->Sa(2)->Sb(1)->Sa(1)->Sa(2)->Sb(2)->Sa(1)->Sa(2)->Sb(3), until step Sa(1)->Sa(2)->Sb(N).

23. An input device, comprising:
a key scan circuit, comprising N+1 scan lines Row 0 to Row N and a plurality of signal sensing lines, where N is a positive integer, wherein the key scan circuit performs following steps:
step (1), starting a scan cycle, and determining whether the input device is currently in one of a first scan mode, a second scan mode, or a third scan mode to respectively perform one of step (2), step (3) or step (4);
step (2), when the input device is in the first scan mode, the key scan circuit performing the steps of:
   sequentially triggering one of the plurality of scan lines Row 0 to Row N until each of the plurality of scan lines is triggered, reading electrical signals received via the plurality of signal sensing lines, detecting whether any of a plurality of keys of the input device is triggered, and ending the scan cycle;
step (3), when the input device is in the second scan mode, the key scan circuit performing the steps of:
   step (3a), defining the scan line Row 0 as a first main scan line Sa(1) and defining the scan lines Row 1 to Row N as N secondary scan lines Sb(1) to Sb(N);
   step (3b), defining X1 keys among the plurality of keys electrically connected to the first main scan line Sa(1) as a first key group, and defining another Y1 keys among the plurality of keys not electrically connected to the first main scan line Sa(1) as a second key group, where X1 and Y1 are positive integers;
   step (3c), setting an initial value of a main scan count j to 0;
   step (3d), determining whether the main scan count j is equal to a preset upper limit Jmax, where the preset upper limit Jmax is a positive integer, performing step (3g) if yes, and performing step (3e) if no;
   step (3e), triggering the first main scan line Sa(1), reading the electrical signals received via the plurality of signal sensing lines, and detecting whether any of the X1 priority keys is triggered;
   step (3f), increasing a value of the main scan count j as j=j+1, and returning to step (3d);
   step (3g), sequentially triggering non-triggered P secondary scan lines among the N secondary scan lines Sb(1) to Sb(N), wherein the P secondary scan lines are coupled to Q secondary keys among the Y1 secondary keys, reading the electrical signals received via the plurality of signal sensing lines, and detecting whether any of the Q secondary keys is triggered, where P<N and Q<Y1, and P and Q are positive integers, wherein at least a next one of the secondary scan lines is non-triggered; and
   step (3i), determining whether all the N secondary scan lines Sb(1) to Sb(N) have been triggered, setting the main scan count j to 0 and returning to step (3d) if no, and ending the scan cycle if yes;
   wherein steps (3e) and step (3g) are performed one after another for multiple times, until each of the N secondary scan lines is triggered at least once to complete the scan cycle; and
step (4), when the input device is in a third scan mode, the key scan circuit performing the steps of:

step (4a), defining the scan lines Row 0 to Row 1 as two main scan lines Sa(1) to Sa(2), and defining the scan lines Row 2 to Row N as N−1 secondary scan lines Sb(1) to Sb(N−1);
step (4b), defining X2 keys among the plurality of keys electrically connected to the two main scan lines Sa(1) to Sa(2) as a first key group and defining another Y2 keys among the plurality of keys not electrically connected to the two main scan lines Sa(1) to Sa(2) as a second key group, where X2 and Y2 are positive integers;
step (4c), setting an initial value of a main scan count j to 0;
step (4d), determining whether the main scan count j is equal to a preset upper limit Jmax, where the preset upper limit Jmax is a positive integer, performing step (4g) if yes, and performing step (4e) if no;
step (4e), sequentially triggering the two main scan lines Sa(1) to Sa(2), reading the electrical signals received via the plurality of signal sensing lines, and detecting whether any of the X2 priority keys is triggered;
step (4f), increasing a value of the main scan count j as j=j+1, and returning to step (4d);
step (4g), sequentially triggering non-triggered P secondary scan lines of the N−1 secondary scan lines Sb(1) to Sb(N-1), wherein the P secondary scan lines are coupled to Q secondary keys among the Y2 secondary keys, reading the electrical signals received via the plurality of signal sensing lines, and detecting whether any of the Q secondary keys is triggered, where P<N−1 and Q<Y2, and P and Q are positive integers, wherein at least a next one of the secondary scan lines is non-triggered; and
step (4h), determining whether all the N−1 secondary scan lines Sb(1) to Sb(N-1) have been triggered, setting the main scan count j to 0 and returning to step (4d) if no, and ending the scan cycle if yes.

24. The input device according to claim 23, wherein the second scan mode is an electronic sports mode, and the X1 priority keys comprise at least four English letter keys "W", "A", "S" and "D" and four arrow keys "up", "down", "left" and "right".

25. The input device according to claim 23, wherein the third scan mode is a word processing mode, and the X2 priority keys comprise at least 26 English letter keys "A to Z" and four arrow keys "up", "down", "left" and "right".

26. A key scanning method, adapted to an input device having a plurality of keys, wherein the input device further has a plurality of scan lines for scanning the plurality of keys and has a plurality of signal sensing lines corresponding to the plurality of keys, and the plurality of scan lines comprise a first main scan line and a plurality of secondary scan lines, wherein the first main scan line is electrically connected to a first key group among the plurality of keys, and the plurality of secondary scan lines are electrically connected to a second key group among the plurality of keys, the key scanning method comprising:
performing a first scan mode, wherein the first scan mode comprises:
   performing a first scan procedure, wherein the first scan procedure comprises triggering the first main scan line and reading electrical signals received via the plurality of signal sensing lines to determine whether any of the keys among the first key group is triggered; and performing a second scan procedure, wherein the second scan procedure comprises triggering at least one of the plurality of secondary scan lines and reading the electrical signals received via the plurality of signal sensing lines to determine whether any of the keys among the second key group is triggered;

wherein the first scan procedure and the second scan procedure are performed one after another, and each of the plurality of secondary scan lines is triggered at least once;

wherein a number of times that the first main scan line is triggered is at least twice a number of times that each of the plurality of secondary scan line is triggered.

* * * * *